(12) United States Patent
Akiyama et al.

(10) Patent No.: US 7,574,648 B2
(45) Date of Patent: Aug. 11, 2009

(54) SEMICONDUCTOR DEVICE

(75) Inventors: Satoru Akiyama, Kawasaki (JP);
Riichiro Takemura, Tokyo (JP);
Tomonori Sekiguchi, Tama (JP)

(73) Assignee: Hitachi, Ltd., Tokyo (JP)

( * ) Notice: Subject to any disclaimer, the term of this patent is extended or adjusted under 35 U.S.C. 154(b) by 484 days.

(21) Appl. No.: 11/194,486

(22) Filed: Aug. 2, 2005

(65) Prior Publication Data
US 2006/0200727 A1 Sep. 7, 2006

(30) Foreign Application Priority Data
Mar. 1, 2005 (JP) ............................. 2005-055294

(51) Int. Cl.
*G11C 29/00* (2006.01)
(52) U.S. Cl. ...................... 714/769; 714/772
(58) Field of Classification Search .................. 714/769, 714/772
See application file for complete search history.

(56) References Cited

U.S. PATENT DOCUMENTS

| | | | | |
|---|---|---|---|---|
| 4,692,923 A | * | 9/1987 | Poeppelman | 714/702 |
| 5,012,472 A | | 4/1991 | Arimoto et al. | 371/40.1 |
| 5,056,095 A | * | 10/1991 | Horiguchi et al. | 714/765 |
| 5,134,616 A | * | 7/1992 | Barth et al. | 714/711 |
| 5,784,391 A | * | 7/1998 | Konigsburg | 714/773 |
| 6,889,307 B1 | * | 5/2005 | Scheuerlein | 711/202 |
| 7,219,271 B2 | * | 5/2007 | Kleveland et al. | 714/718 |
| 2002/0018389 A1 | * | 2/2002 | Ito et al. | 365/222 |
| 2004/0221098 A1 | * | 11/2004 | Ito et al. | 711/106 |

FOREIGN PATENT DOCUMENTS

| | | |
|---|---|---|
| JP | 1-171199 | 7/1989 |
| JP | 2002-56671 | 2/2002 |

OTHER PUBLICATIONS

Itoh, K., "High Signal-to-Noise Ratio DRAM Design and Technology", *VLSI Memory Chip Design*, pp. 195-248, Spring, 2001.
Itoh et al., "Reviews and Prospects of High-Density RAM Technology", CAS2000, IEEE, pp. 13-22, Oct. 2000.
Hieda et al., "Low Temperature (Ba,Sr)TiO$_3$ Capacitor Process Integration (LTB) Technology for Gigabit Scaled DRAMS", 1999 IEDM, pp. 289-292.

* cited by examiner

*Primary Examiner*—M. Mujtaba K Chaudry
(74) *Attorney, Agent, or Firm*—Miles & Stockbridge P.C.

(57) ABSTRACT

When the miniaturization of a DRAM advances, the capacity of a cell capacitor decreases, and further the voltage of a data line is lowered, the amount of read signals remarkably lowers, errors are produced during readout, and the yield of chips lowers. To solve the above problems, the present invention provides a DRAM that: has an error correcting code circuit for each sub-array; detects and corrects errors with said error correcting code circuit in both the reading and writing operations; and further has rescue circuits in addition to said error correcting code circuits and replaces a defective cell caused by hard error with a redundant bit.

19 Claims, 20 Drawing Sheets

FIG. 7

$$G = \begin{Bmatrix} 11111111 & 00000000 & 00000000 & 00000111 & 00111000 & 01001001 & 10010010 \\ 11100100 & 11111111 & 00000000 & 00000000 & 00000111 & 00111000 & 01001001 \\ 10010010 & 11100100 & 11111111 & 00000000 & 00000000 & 00000111 & 00111000 \\ 01001001 & 10010010 & 11100100 & 11111111 & 00000000 & 00000000 & 00000111 \\ 00111000 & 01001001 & 10010010 & 11100100 & 11111111 & 00000000 & 00000000 \\ 00000111 & 00111000 & 01001001 & 10010010 & 11100100 & 11111111 & 00000000 \\ 00000000 & 00000111 & 00111000 & 01001001 & 10010010 & 11100100 & 11111111 \\ 00000000 & 00000000 & 00000111 & 00111000 & 01001001 & 10010010 & 11100100 \end{Bmatrix}$$

$$H = \begin{Bmatrix} 11111111 & 00000000 & 00000000 & 00000111 & 00111000 & 01001001 & 10010010 & 10000000 \\ 11100100 & 11111111 & 00000000 & 00000000 & 00000111 & 00111000 & 01001001 & 01000000 \\ 10010010 & 11100100 & 11111111 & 00000000 & 00000000 & 00000111 & 00111000 & 00100000 \\ 01001001 & 10010010 & 11100100 & 11111111 & 00000000 & 00000000 & 00000111 & 00010000 \\ 00111000 & 01001001 & 10010010 & 11100100 & 11111111 & 00000000 & 00000000 & 00001000 \\ 00000111 & 00111000 & 01001001 & 10010010 & 11100100 & 11111111 & 00000000 & 00000100 \\ 00000000 & 00000111 & 00111000 & 01001001 & 10010010 & 11100100 & 11111111 & 00000010 \\ 00000000 & 00000000 & 00000111 & 00111000 & 01001001 & 10010010 & 11100100 & 00000001 \end{Bmatrix}$$

$$\underbrace{\phantom{xxxxxxxxxxxxxxxxxxxxxxxxxxxxxxxxxxxxxxxxxxxxxxxxxxxxxxxxxxxxxxxxxxxxxxxx}}_{\text{INFORMATION BIT I (D0-D63)}} \underbrace{\phantom{xxxxxxxxx}}_{\text{CHECK BIT P}}$$

$$X = \{ 01111111 \quad 00000010 \quad 00000000 \quad 01010100 \quad 00010010 \quad 11111000 \quad 01111111 \quad 11101111 \}$$

$$Y = \{ 01111111 \quad 00000010 \quad 00000000 \quad 01010100 \quad 00010010 \quad 11111000 \quad 01111111 \quad 11101111 \}$$

$$S = \{ 00000000 \}$$

$$e = \{ 10000000 \quad 00000000 \quad 00000000 \quad 00000000 \quad 00000000 \quad 00000000 \quad 00000000 \quad 00000000 \}$$

$$Y' = \{ 11111111 \quad 00000010 \quad 00000000 \quad 01010100 \quad 00010010 \quad 11111000 \quad 01111111 \quad 11101111 \}$$

$$S' = \{ 11100000 \}$$

$$\underbrace{\phantom{xxxxxxxxxxxxxxxxxxxxxxxxxxxxxxxxxxxxxxxxxxxxxxxxxxxxxxxxxxxxxxxxxxxxxxxx}}_{\text{INFORMATION BIT I'' (D0-D63)}} \underbrace{\phantom{xxxxxxxxx}}_{\text{CHECK BIT P''}}$$

$$X'' = \{ 01111111 \quad \underline{11}000010 \quad 00000000 \quad 01010100 \quad 00010010 \quad 11111000 \quad 01111111 \quad 11101111 \}$$

EXOR

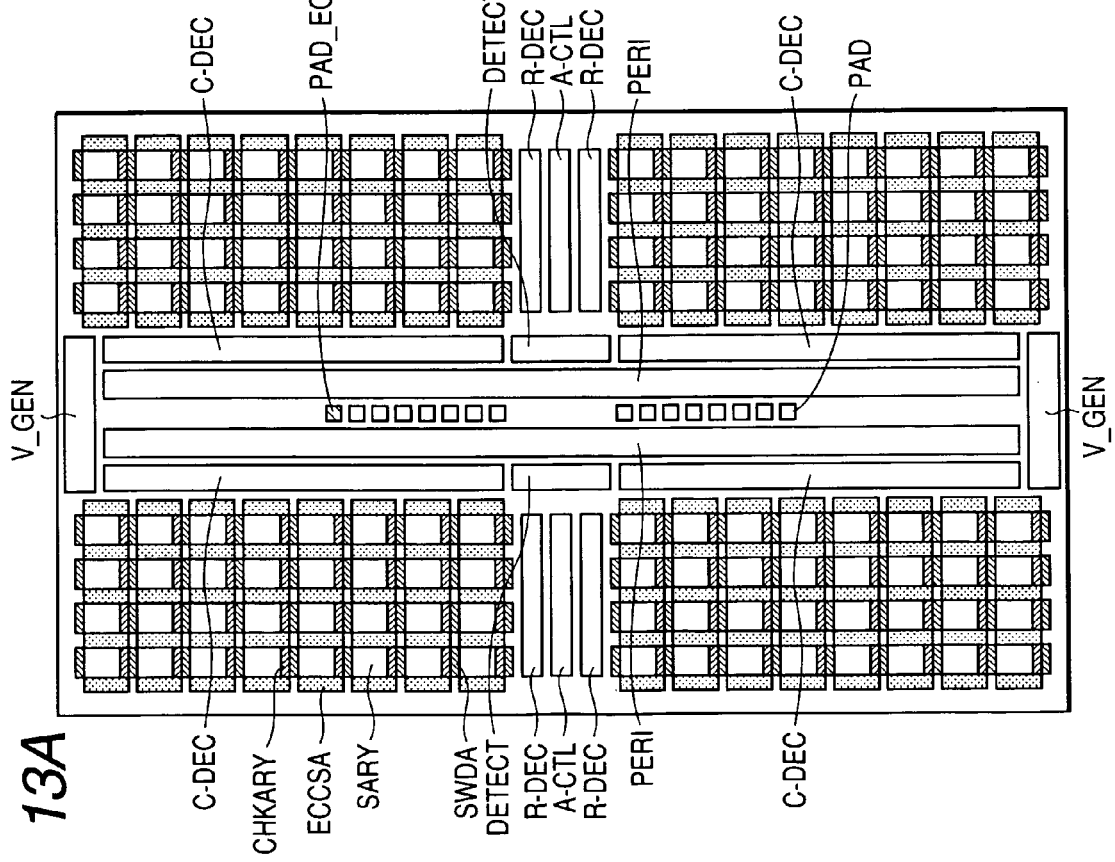
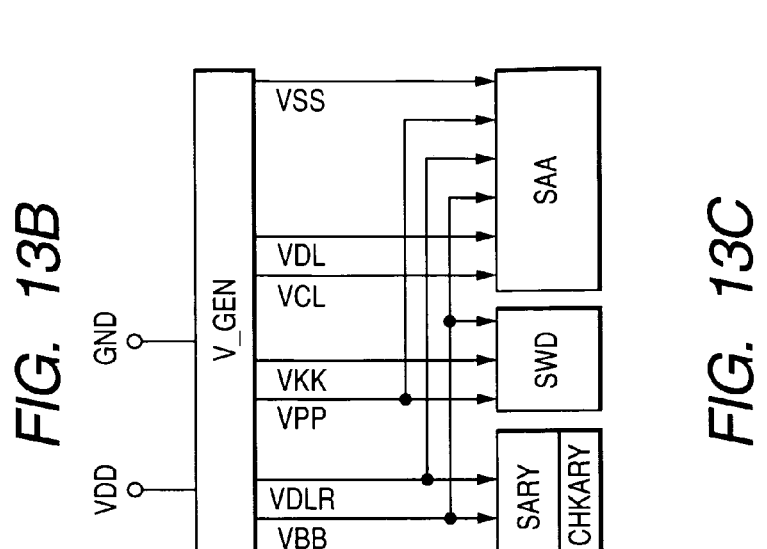

FIG. 20

|  | 65nm NODE | 45nm NODE |
|---|---|---|
| DATA LINE VOLTAGE VDL (V) | ~1.0 | ~0.8 |
| CELL CAPACITANCE CS (fF) | ~20 | ~15 |
| GATE LENGTH Lg (CELL/SA) (nm) | ~65/ ~200 | ~45/ ~100 |
| GATE WIDTH W (CELL/SA) (um) | ~0.065/ ~2 | ~0.045/ ~1 |
| GATE OXIDE FILM THICKNESS Tox (CELL/SA) (nm) | ~6/ ~4 | ~5/ ~3 |

SEMICONDUCTOR DEVICE

CLAIM OF PRIORITY

The present application claims priority from Japanese application JP 2005-055294 filed on Mar. 1, 2005, the content of which is hereby incorporated by reference into this application.

FIELD OF THE INVENTION

The present invention relates to a semiconductor device and more particularly to an error correcting code circuit of a low-power high-speed semiconductor memory device.

BACKGROUND OF THE INVENTION

Dynamic random access memories (hereunder referred to as "DRAM"), a kind of semiconductor memory devices, are mounted in quantity on various electric devices, which we usually use, as main memories of large-scale computers and personal computers and work memories of digital appliances such as mobile phones, digital cameras and the like. Then in accordance with the recent needs for the devices having lower power consumption and higher performances, DRAMs to be mounted on the devices are also required to have higher performances including a lower power, a higher speed and a larger capacity. In particular, the DRAMs mounted on digital appliances are strongly required to have lower power consumption.

One of the most effective means for realizing a DRAM of low power consumption is to operate a memory array at a low data line voltage. By operating a memory array at a low data line voltage, it is possible to remarkably reduce the charge and discharge power dissipation of a data line. In order to operate a DRAM at a low voltage, it is effective to miniaturize a cell transistor and a cell capacitor used for a memory cell of the DRAM. The size of the memory cell can be reduced by the miniaturization. As a result, the length of the data line can be shortened and thus the parasitic capacitance of the data line can be reduced, and therefore low voltage operation can be realized and thus low power consumption can also be realized. Further, since the parasitic capacitance of the data line can be reduced, a high-speed sense amplifier operation can also be realized. Furthermore, since the size of the memory cell is reduced, the capacity of the memory can be increased and thus the device of higher performances can be realized. In this manner, not only the low power but also the miniaturization largely contributes to the realization of higher performances. Hence, it is generally believed that, not only in the case of an existing product but also in the case of a product to be hereafter developed, higher performances, namely lower power consumption and others, are advanced by such miniaturization.

However, as the miniaturization advances up to 65 nm nodes to 45 nm nodes, not only the effect of such higher performances as described above but also various side-effects appear. One of the side-effects is that the miniaturization makes it impossible to secure a memory cell having a sufficiently large capacitance. In the case where a sufficiently large cell capacitance is not secured for example, when a data line voltage VDL is lowered to about 1 V, sometimes the amount of so-called read-out signal voltage of a DRAM may lower and errors may be caused at the time of readout. Further, it sometimes happens that the gate length Lg and the gate width W of a sense amplifier circuit decrease and thus the mismatch of the threshold voltage of the sense amplifier circuit increases, or the gate length Lg and the gate width W of a cell transistor decrease and thus the variation of the threshold voltage of the cell transistor increases, and that causes errors to appear at the time of readout. Therefore, when miniaturization advances, there is the danger that low voltage operation is hardly secured and low power consumption cannot be realized. Such problems are well known as the problems arising when DRAM cells are miniaturized and are precisely described in Kiyoo Itoh, "VLSI Memory Chip Design," pp. 195-248, Spring, 2001.

As one of the methods for solving the problem of the decrease of the amount of read signals and realizing low voltage operation, there is a means of reducing the number of memory cells connected to one data line and thus shortening the length of the data line. Since the parasitic capacitance of a data line can be reduced by dividing an array and shortening the length of the data line, low voltage operation can be secured. However, as described in Kiyoo Itoh et al., CAS2000, pp. 13-22, October 2000, when an array is merely divided, the area of the chip considerably increases and thus the cost also increases. Further, as described in K. Hieda et al., 1999 IEDM, pp. 289-292, there is a means of applying a high dielectric material such as BST as a dielectric film material used for a cell capacity. However, the material is poor in heat resistance, not consistent with existing DRAM processes, and thus hardly applicable to practical use. Hence, it is desirable to realize a lower voltage by a means not requiring large modification of the processes or addition of a process while inhibiting to the minimum the area of a chip from increasing. As a method for the purpose, there is a means of adding an error correcting code (hereunder referred to as "ECC") circuit to an array and correcting the information of a bit wrongly read out. As described in JP-A No. 56671/2002 for example, it becomes possible to correct an error bit at the time of readout by adding an ECC circuit to a peripheral circuit section of a DRAM. As a result, correct data can be read out even when miniaturization advances and thus a cell capacity decreases. In other words, in the case where miniaturization advances and a sufficiently large cell capacitance cannot be secured, even when the voltage of a data line is lowered, by using an ECC circuit, stable readout operation can be secured and low power consumption can be realized. Meanwhile, JP-A No. 171199/1989 discloses a means of correcting errors with an ECC circuit during ordinary operation.

SUMMARY OF THE INVENTION

However, in the case of JP-A No. 56671/2002, a DRAM: produces and stores check bits necessary for the detection and correction of an error when the DRAM enters the mode wherein only data storing operation is carried out; and corrects the error with an ECC circuit when the DRAM returns from the mode to ordinary operation. Therefore, the mode wherein power consumption can be reduced is limited to the mode wherein only the data storing operation is carried out. That is, low power cannot be attained during ordinary operation. Further, when it is attempted to correct an error with an ECC circuit during ordinary operation in such a circuit structure as described in JP-A No. 56671/2002, it is necessary to amplify more I/O lines in comparison with the case where an ECC circuit is not added and that causes power consumption to increase. Furthermore, during writing operation too, it is necessary to read out a data in an array by all means and the problem is that the access speed lowers up to about a half. In addition, although JP-A No. 171199/1989 describes the means of adding an ECC circuit to each so-called BANK of a DRAM and detecting and correcting an error, it does not take into consideration the increase of power in an I/O line and the lowering of an access speed. Moreover, it describes nothing regarding remedies.

In view of the above situation, the object of the main invention disclosed in the present applied specification is, while solving the above problems, to realize a memory capable of inhibiting to the minimum electric current consumption during operation from increasing while avoiding lowering the speed of reading and writing data during ordinary operation in a DRAM having an error correcting code circuit.

The outline of a typical invention in the inventions disclosed in the present application is briefly explained hereunder.

In a semiconductor memory device having plural sub-arrays each of which comprises plural memory cells and plural sense amplifier circuits, each of the sub-arrays has an ECC circuit and corrects data wrongly read out at each sub-array by using the ECC circuit. It is further desirable that each sub-array has plural redundant bits with which defective bits are replaced. Further, each sub-array has plural check bits to detect and correct an error when the data of the redundant bit with which a defective bit is replaced is wrongly read out. Furthermore, each sub-array has a novel circuit for a check matrix to detect and correct the defective check bit when a check bit is a defective bit.

The main invention disclosed in the present applied specification makes it possible to realize low voltage operation. Further, it makes it possible to read out data at a high speed and also to realize a highly integrated semiconductor device.

BRIEF DESCRIPTION OF THE DRAWINGS

FIG. 7 is a diagram showing an example of: a check matrix and a generation matrix used in the error correcting code circuit of the embodiment shown in FIG. 5; and a syndrome generated by using those;

FIGS. 13A, 13B, and 13C are diagrams showing an example of a DRAM chip comprising plural sub-arrays each of which uses the error correcting code circuit shown in FIG. 5;

FIG. 20 is a table showing an example of the constants regarding cell capacitors and transistors in the cases of 65 nm nodes and 45 nm nodes.

DETAILED DESCRIPTION OF THE PREFERRED EMBODIMENTS

The embodiments according to the present invention are hereunder explained using the drawings. A transistor composing each block in the embodiments is not particularly limited and is formed on a semiconductor substrate such as a monocrystalline silicon by a known integrated circuit technology of a CMOS (Complementary MOS Transistor) or the like. That is, the transistor is formed through the processes including: the process of forming wells, device isolation regions and oxide films; and the subsequent process of forming gate electrodes and the first and second semiconductor regions to form source and drain regions. With regard to the mark on the circuit of a MOSFET (Metal Oxide Semiconductor Field Effect Transistor), a case of no round mark on a gate represents an N-type MOSFET (NMOS) and is distinguished from a P-type MOSFET (PMOS) having a round mark on a gate. The term "MOSFET" is hereunder simplified and referred to as. "MOS" or "MOS transistor." Note that, the present invention: is not limited to a field-effect transistor containing an oxide film formed between a metal gate and a semiconductor layer; but is also applicable to a circuit using an ordinary FET such as a MISFET (Metal Insulator Semiconductor Field Effect Transistor) containing a dielectric film in between.

Figure 1:
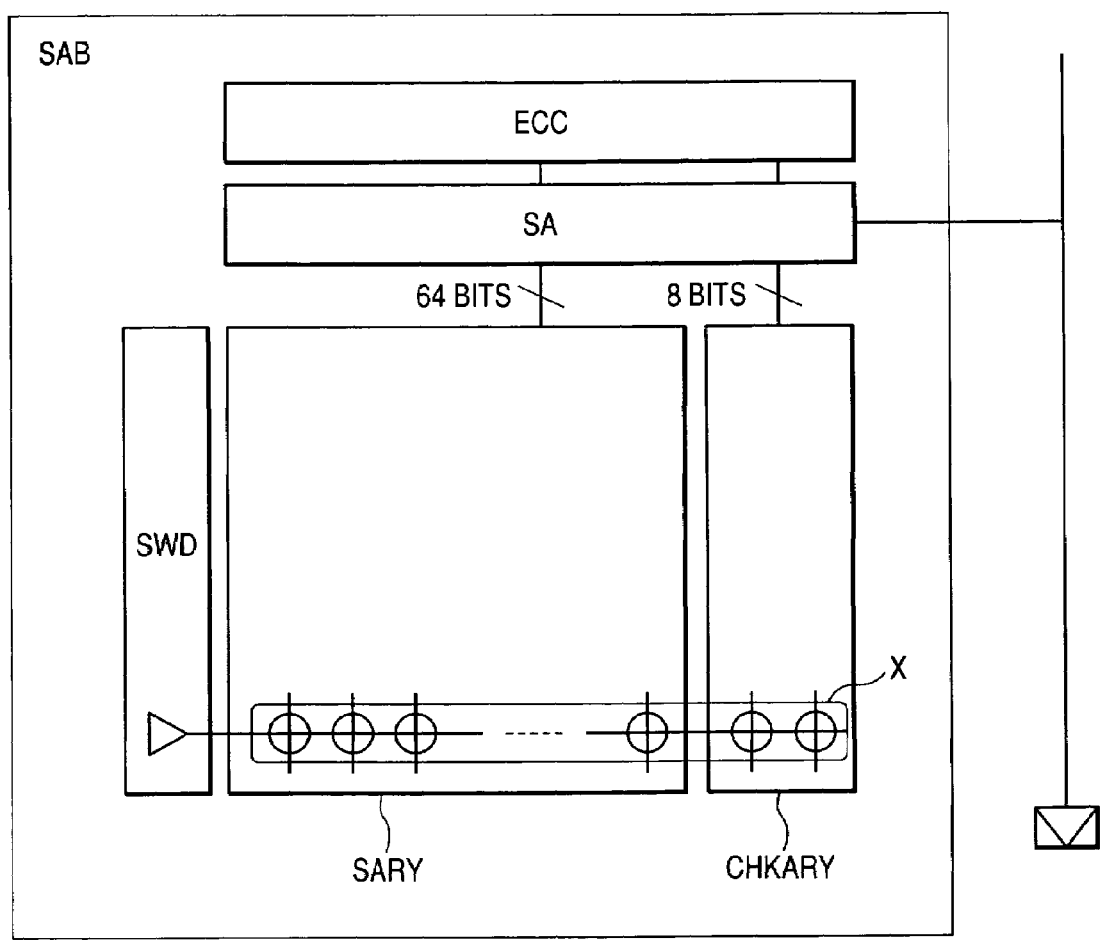
FIG. 1 is a conceptual diagram showing a memory array block of the first embodiment, wherein an error correcting code circuit for a semiconductor memory device according to the present invention is contained and the error correcting code circuit is disposed on each sub-array.
Figure 2:
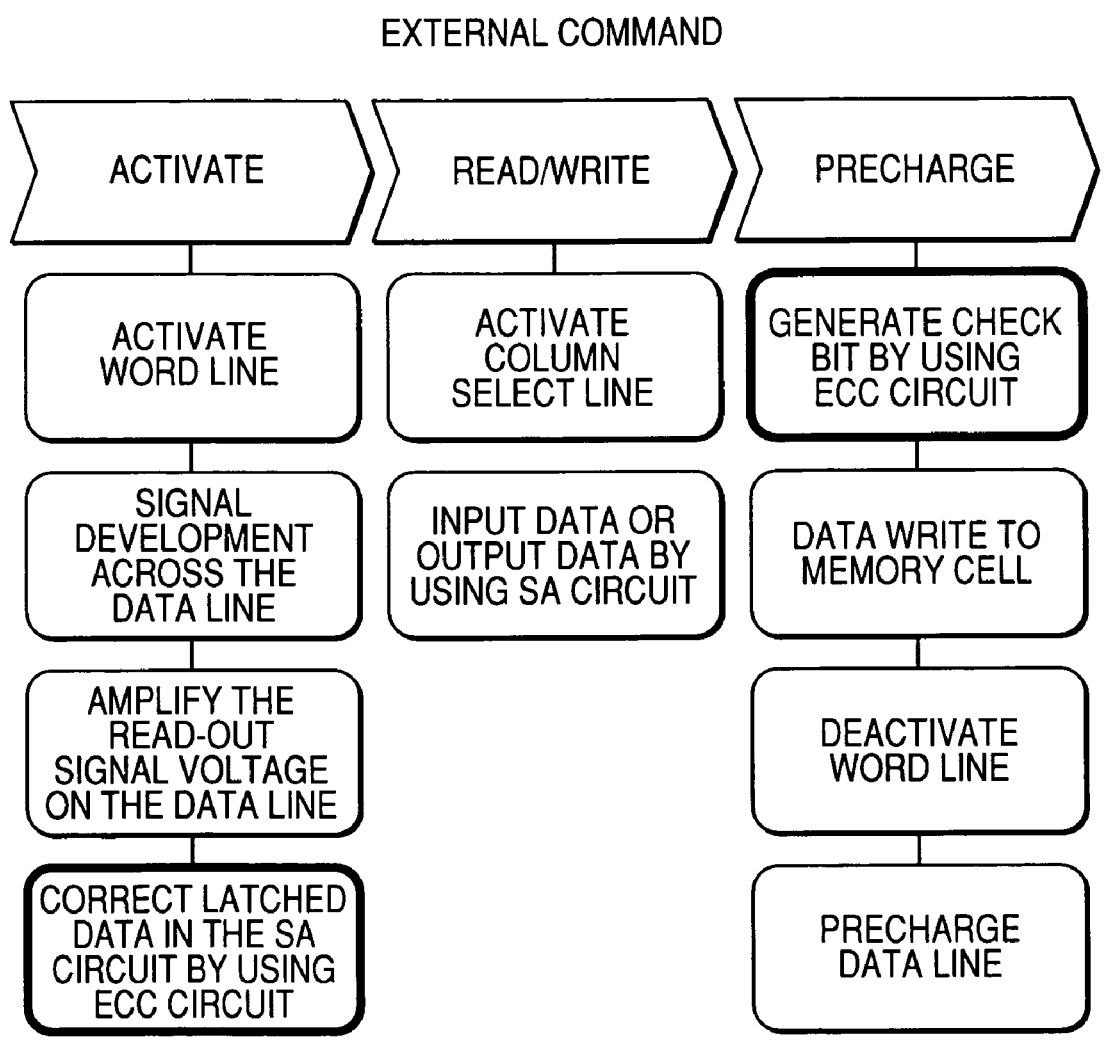
FIG. 2 is a diagram showing an example of operation sequence from the generation of a syndrome to the detection and correction of an error in the error correcting code circuit of the embodiment shown in FIG. 1.
Figure 3:
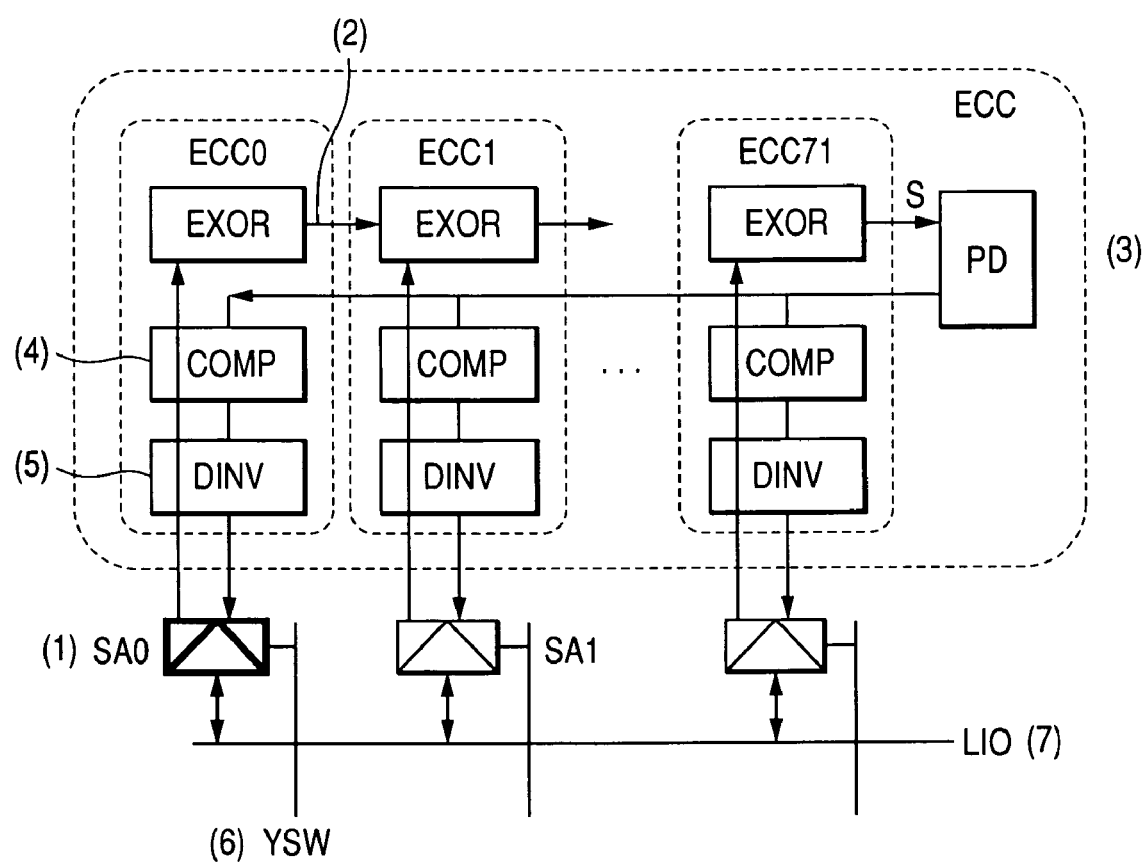
FIG. 3 is a diagram showing an example of the operation sequence of sub-circuits at the time of activation in the operation sequence shown in FIG. 2.
Figure 4:
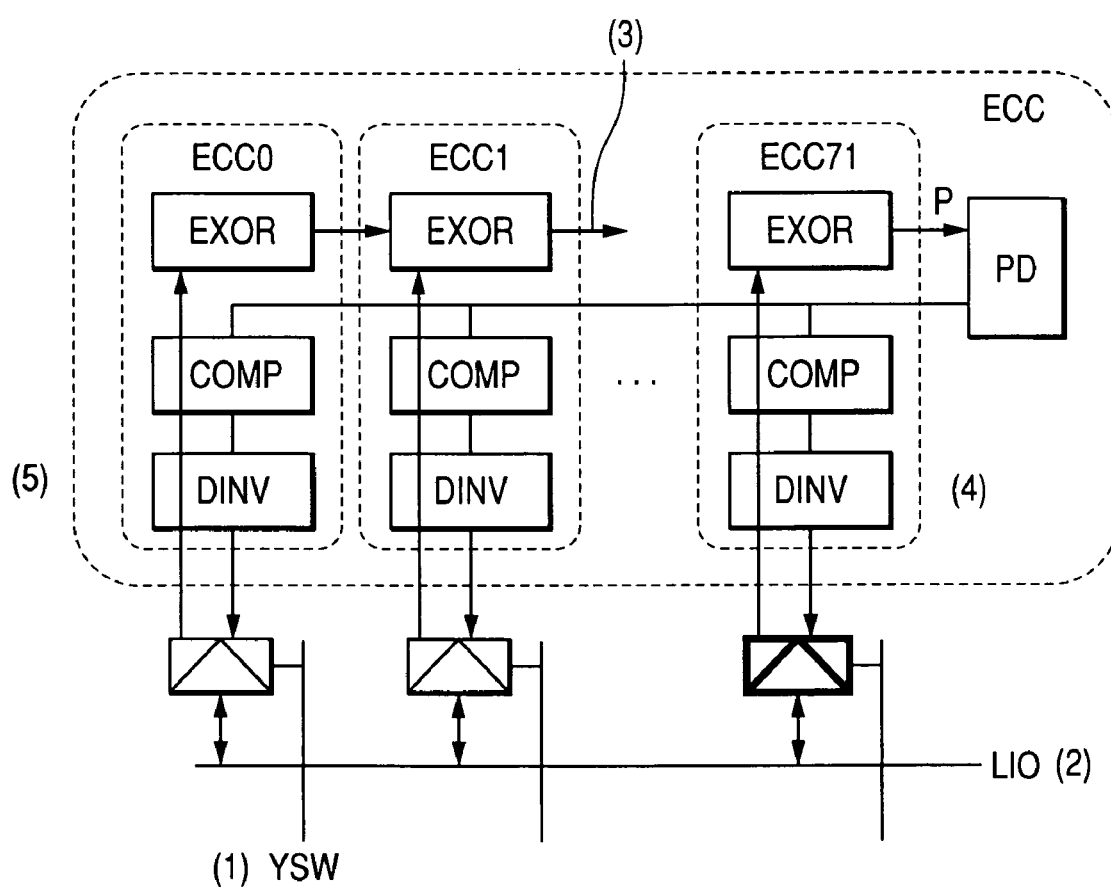
FIG. 4 is a diagram showing an example of the operation sequence of sub-circuits at the time of precharge in the operation sequence shown in FIG. 2.
Figure 5:
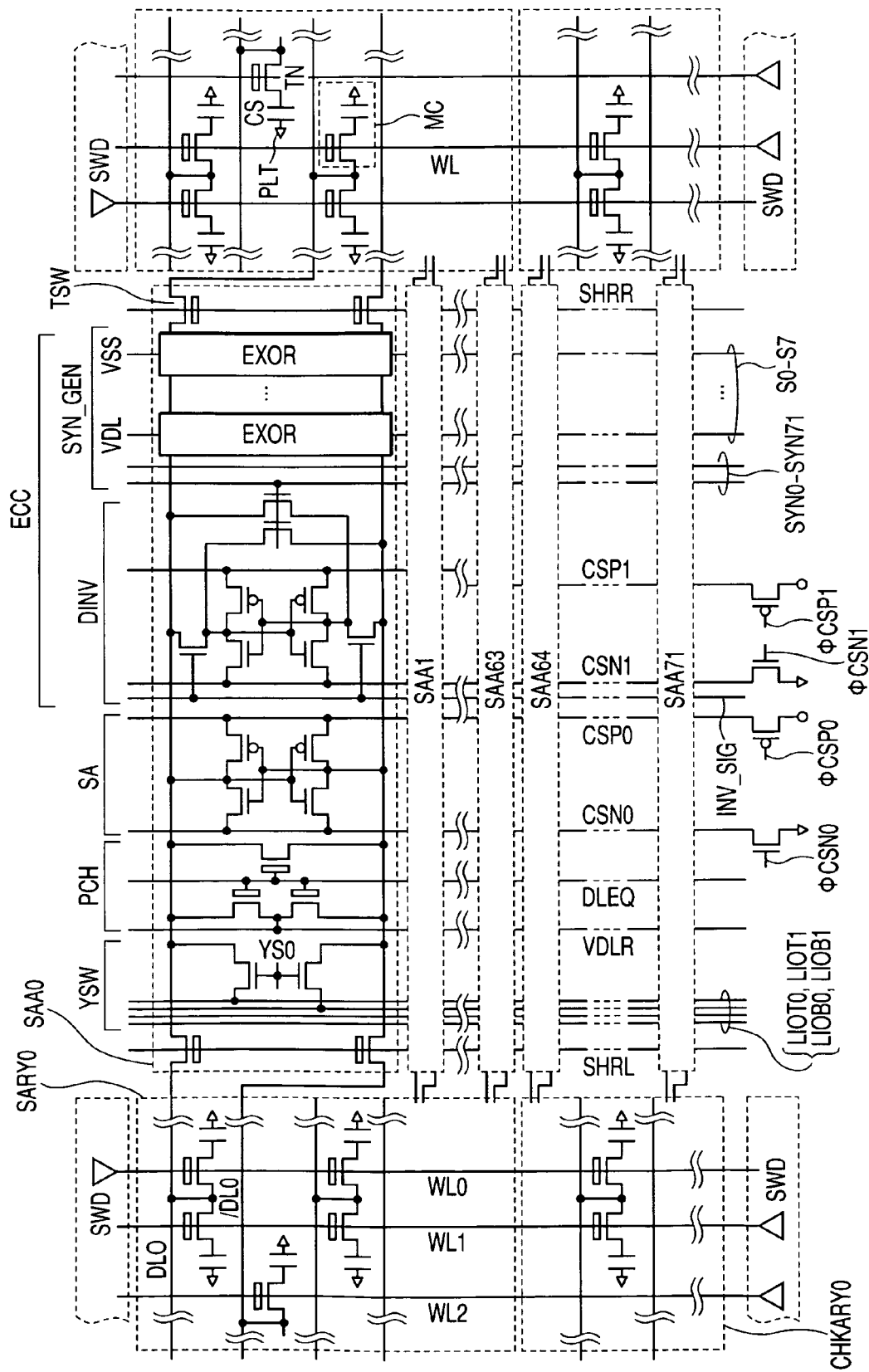
FIG. 5 is a diagram showing an example of each circuit structure to realize the block configuration shown in FIG. 1.
Figure 6:
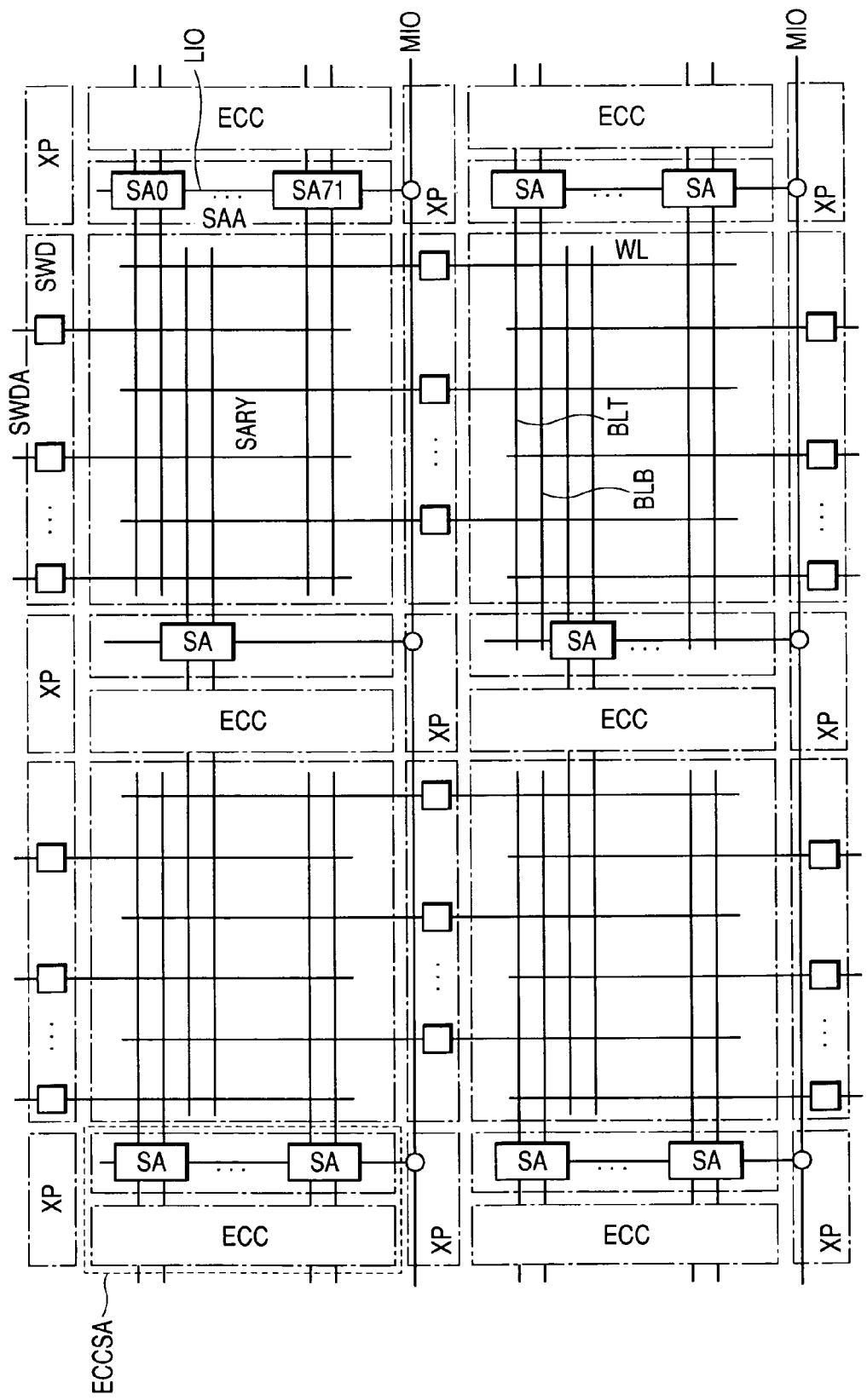
FIG. 6 is a diagram showing an example of a circuit structure to realize the block configuration shown in FIG. 1.
Figure 8:
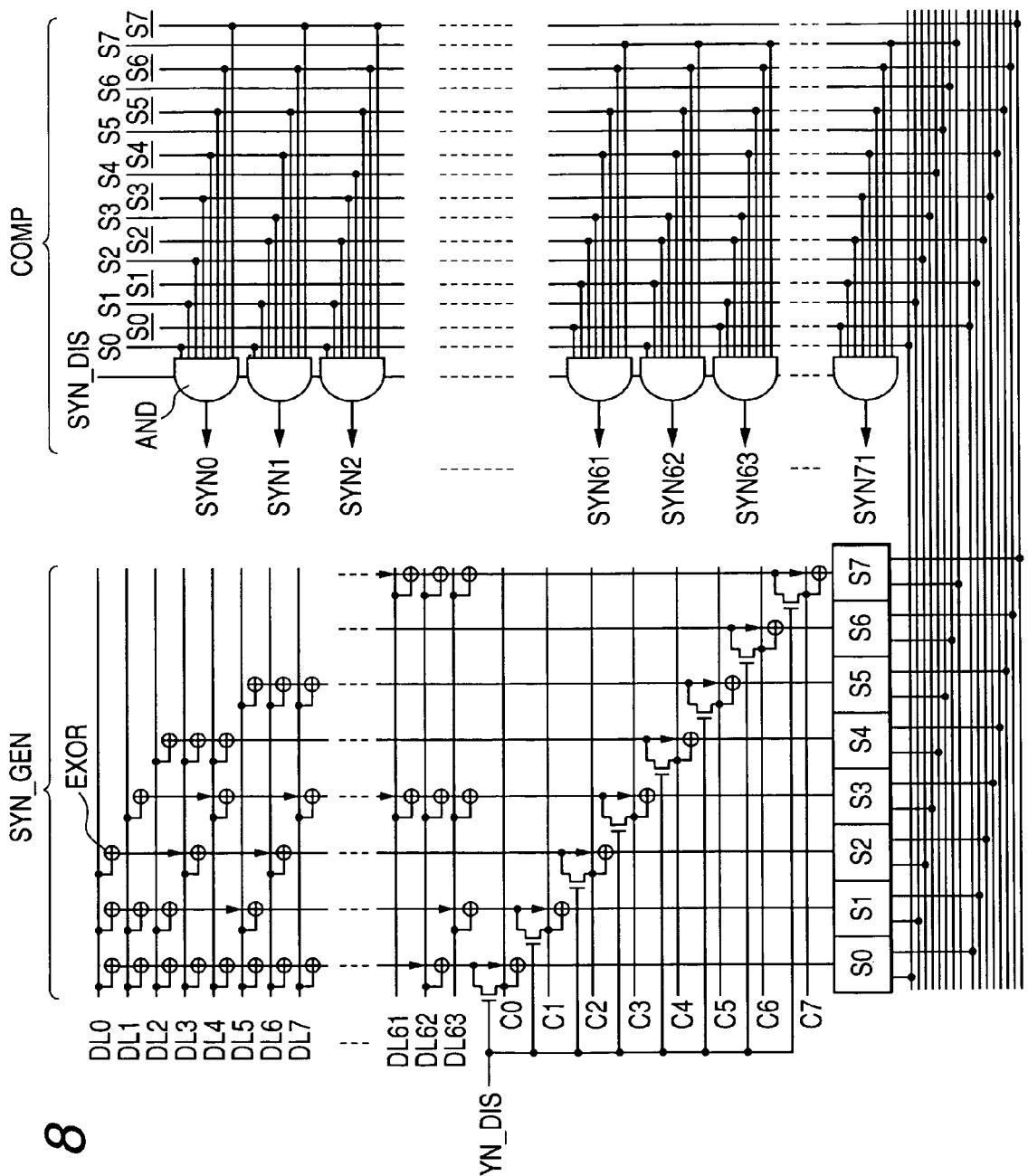
FIG. 8 is a diagram showing an example of the error correcting code circuit shown in FIG. 5.
Figures 10A, 10B:
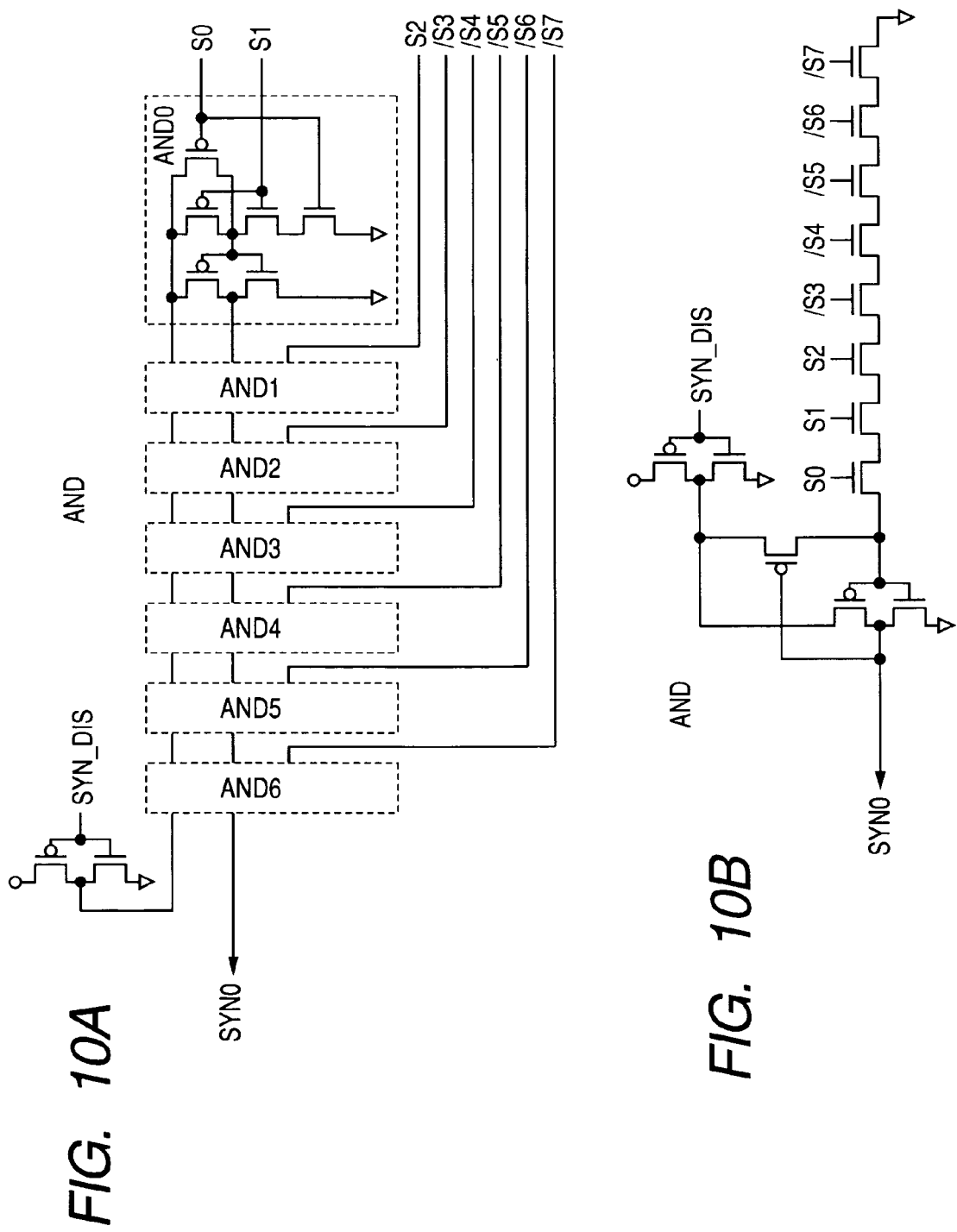
FIG. 10 comprises diagrams showing examples of the AND circuit composing the error correcting code circuit shown in FIG. 8.
Figure 11:
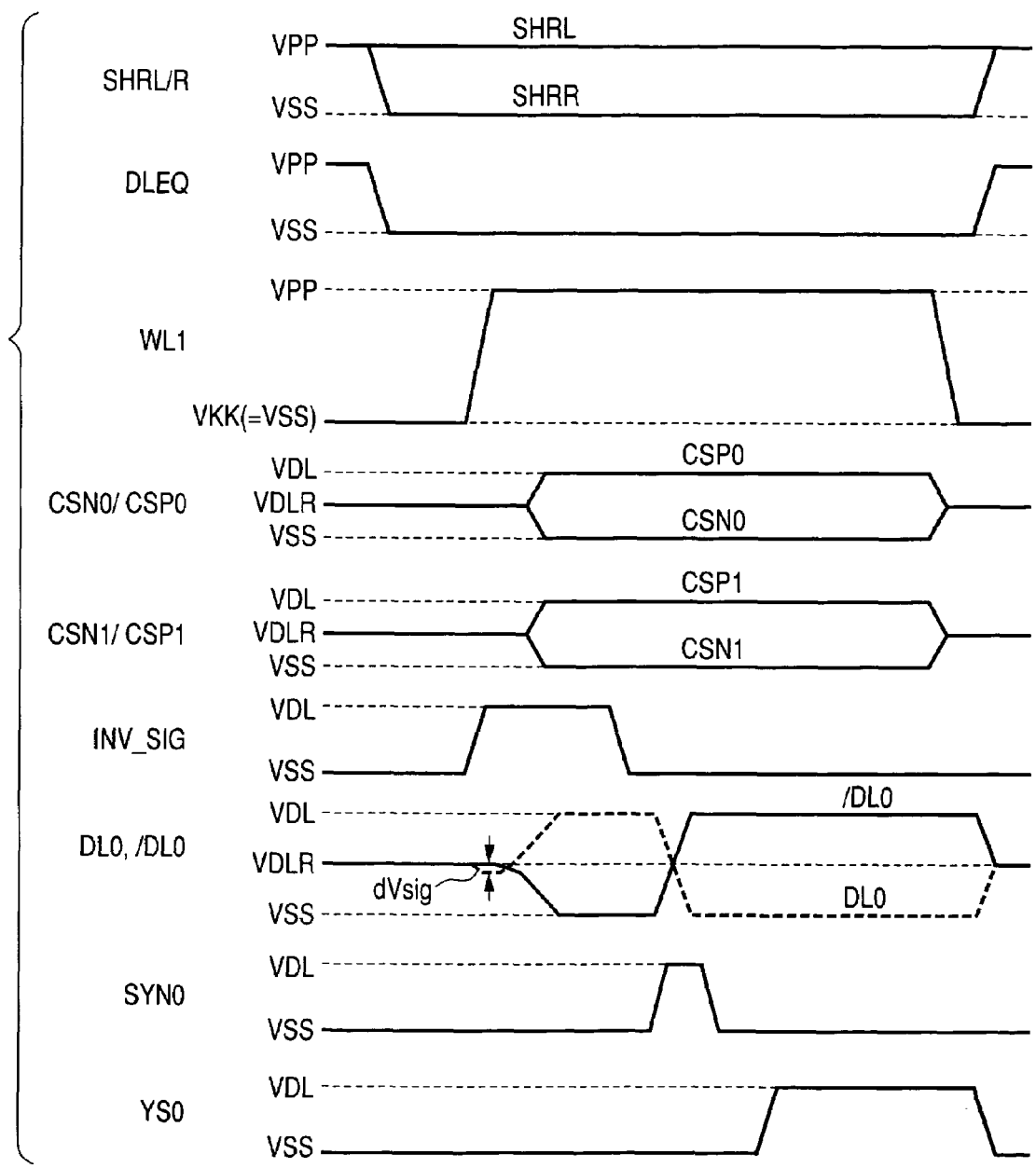
FIG. 11 is a diagram showing an example of readout operation waveforms when the error correcting code circuit shown in FIG. 8 is used.
Figure 12:
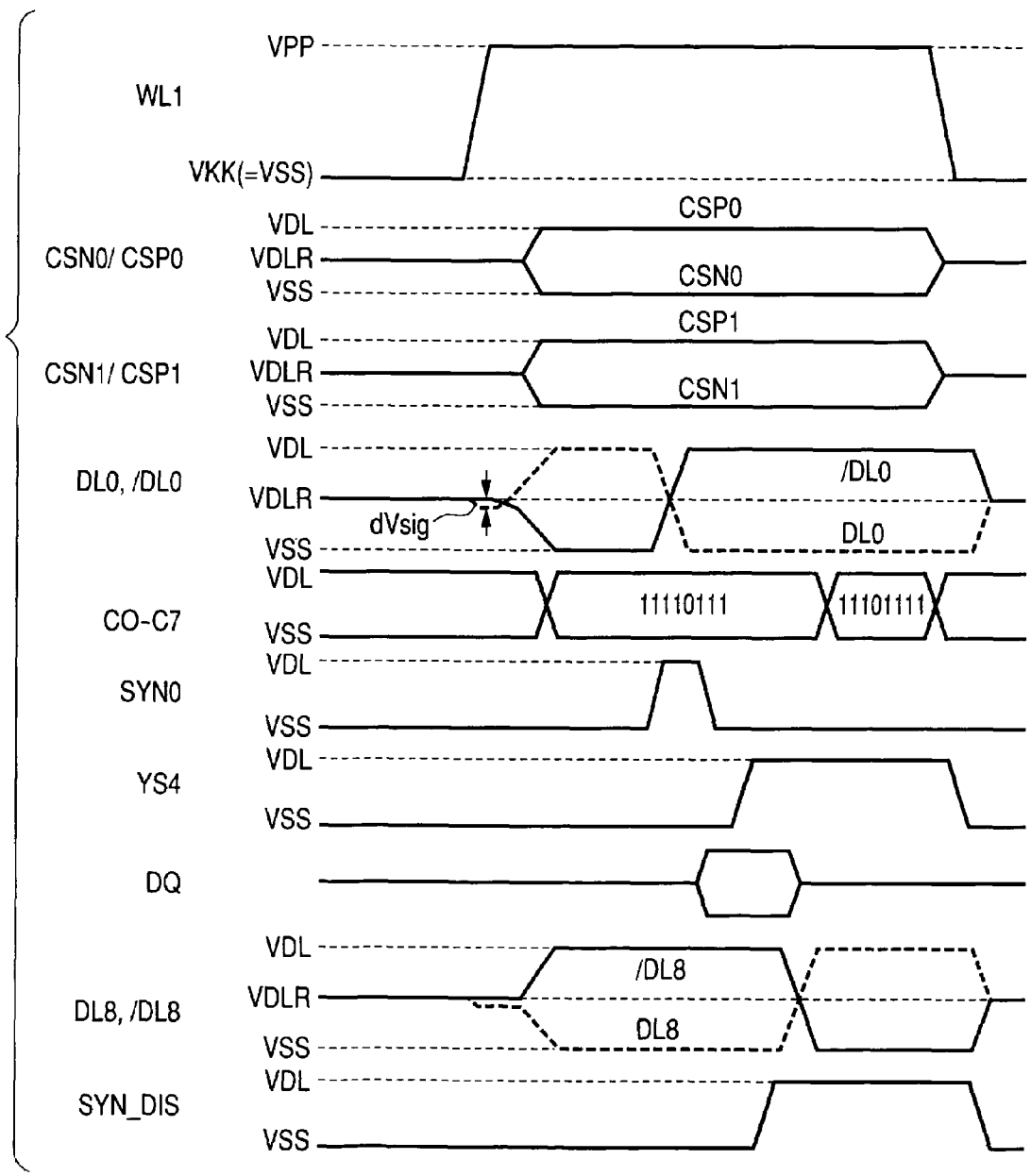
FIG. 12 is a diagram showing an example of writing operation waveforms when the error correcting code circuit shown in FIG. 8 is used.
Figure 14:
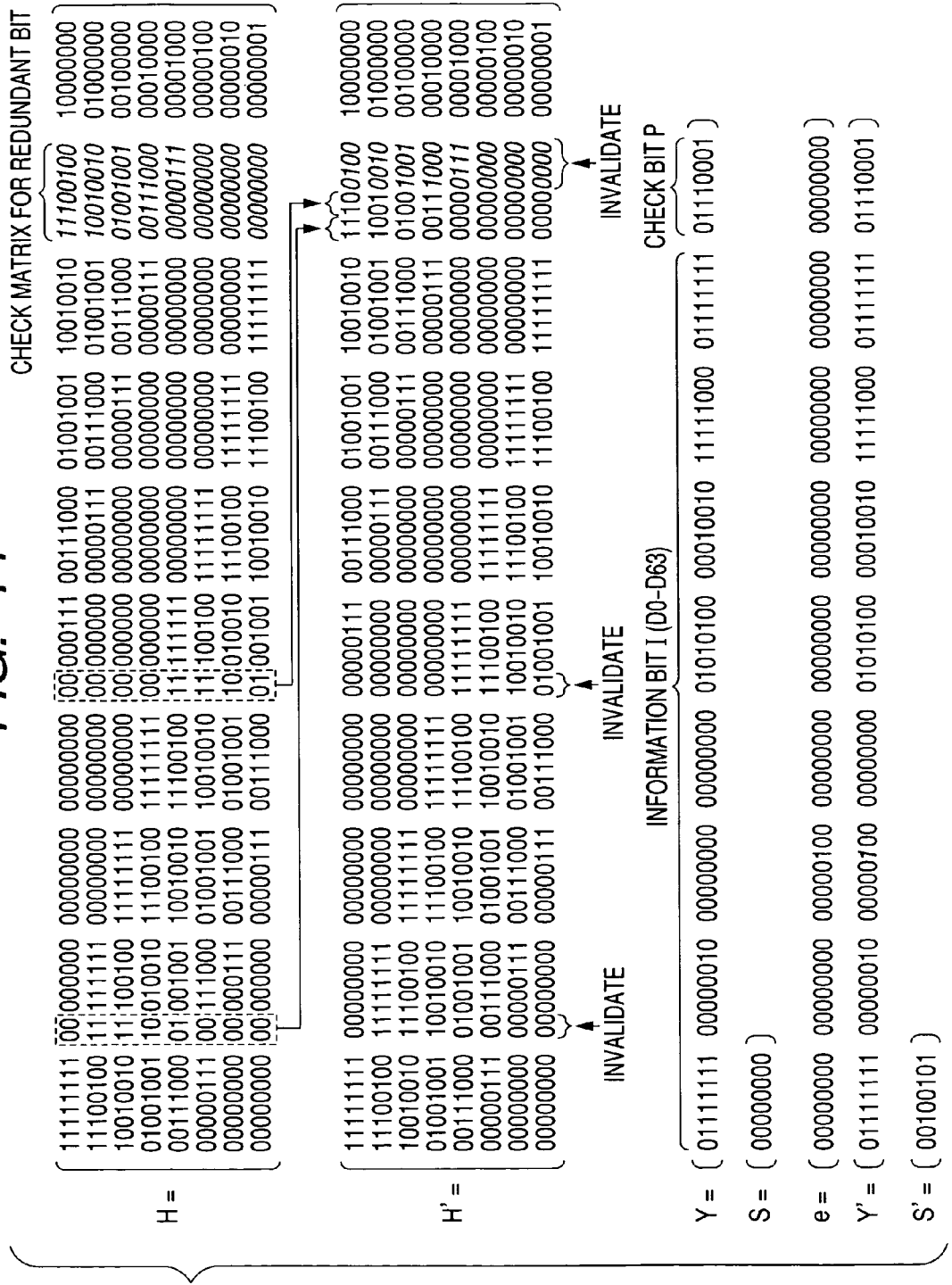
FIG. 14 is a diagram showing an example of: a check matrix used for a circuit to detect and correct an error in redundant bits; and a syndrome generated by using it, as the second embodiment.
Figure 15:
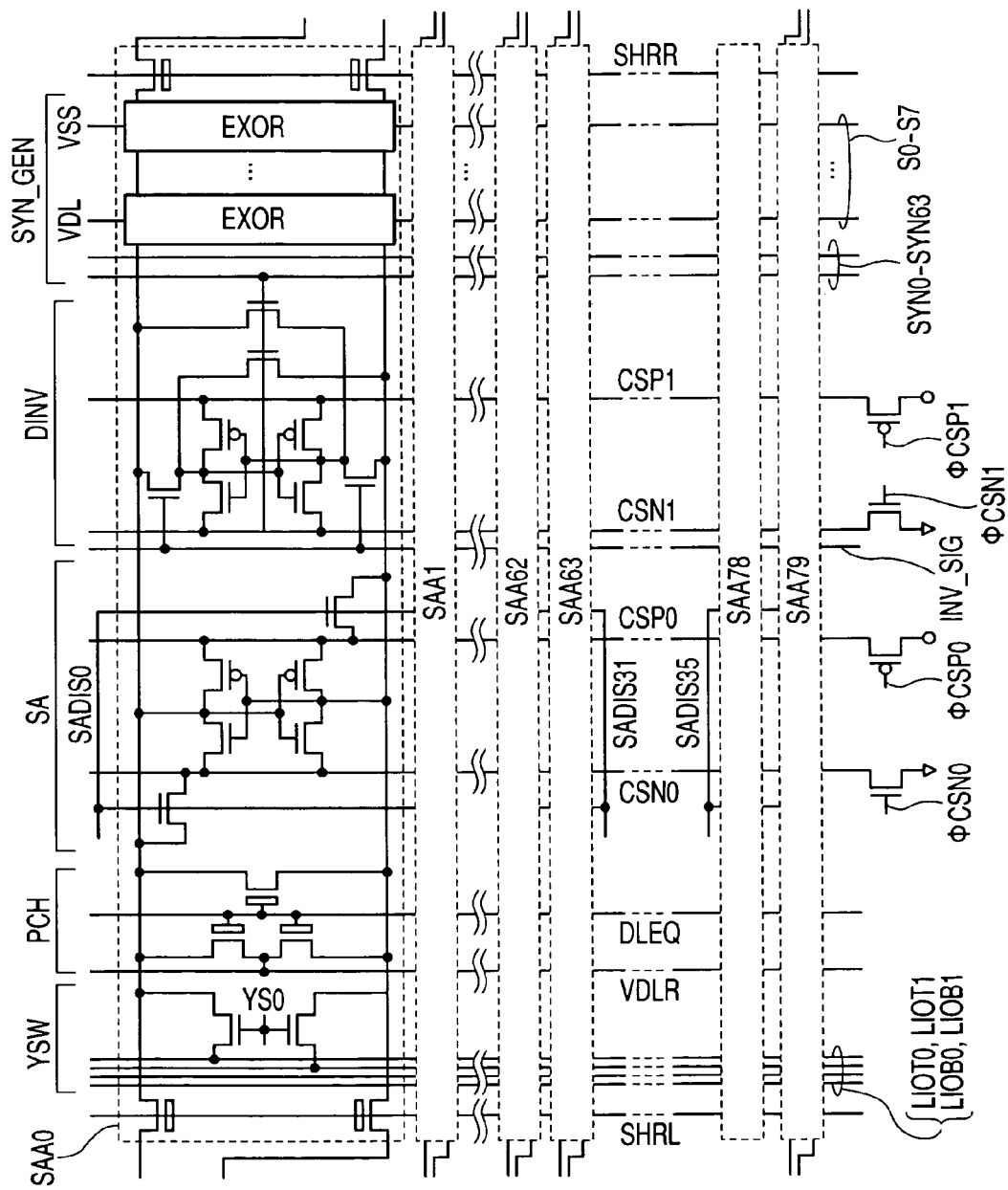
FIG. 15 is a diagram showing an example of the circuit structure of a sense amplifier array including an error correcting code circuit and a means for invalidating the error correcting code circuit when the check matrix shown in FIG. 14 is used.
Figure 16:
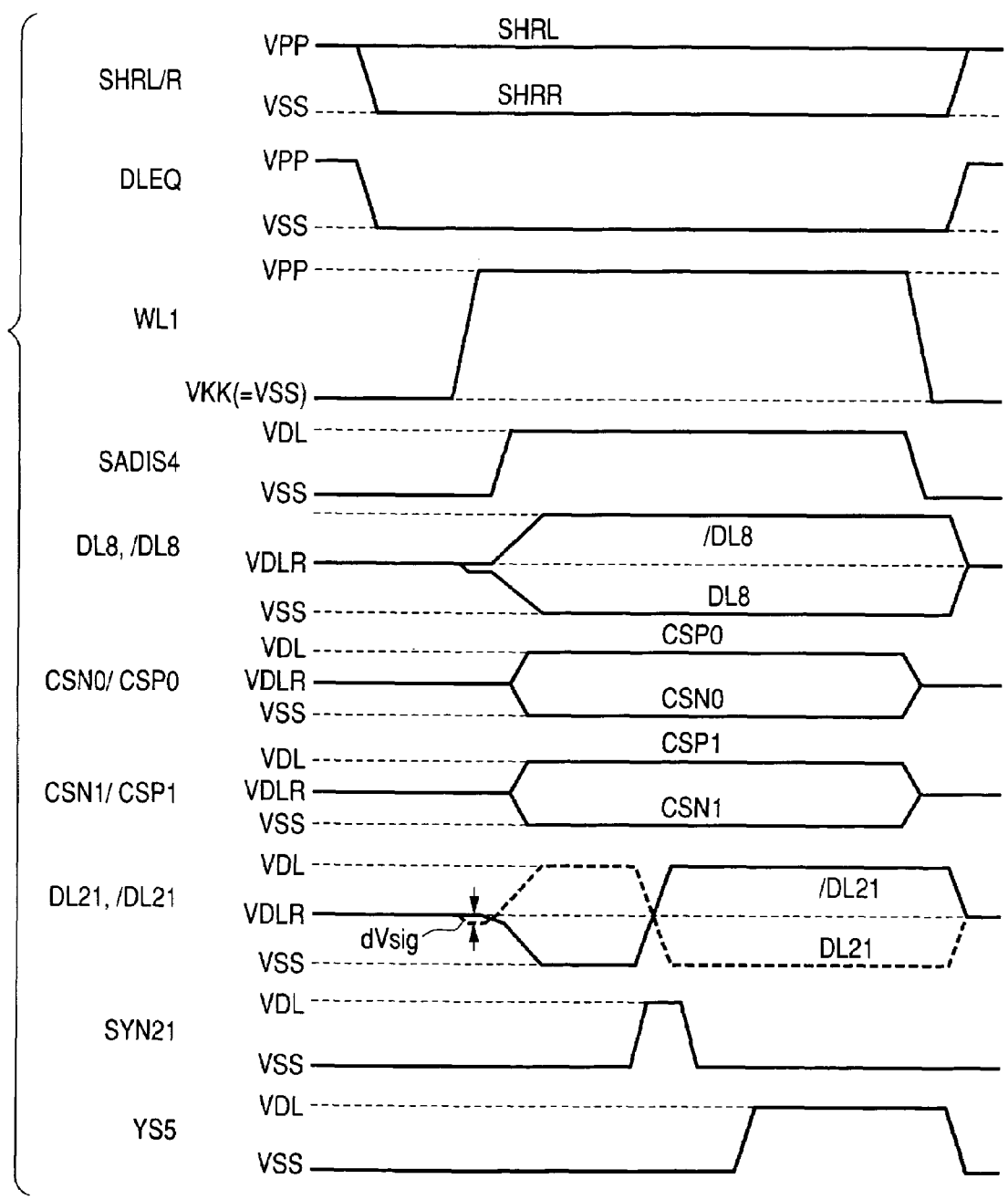
FIG. 16 is a diagram showing an example of readout operation waveforms when the error correcting code circuit shown in FIG. 15 is used.
Figure 17:
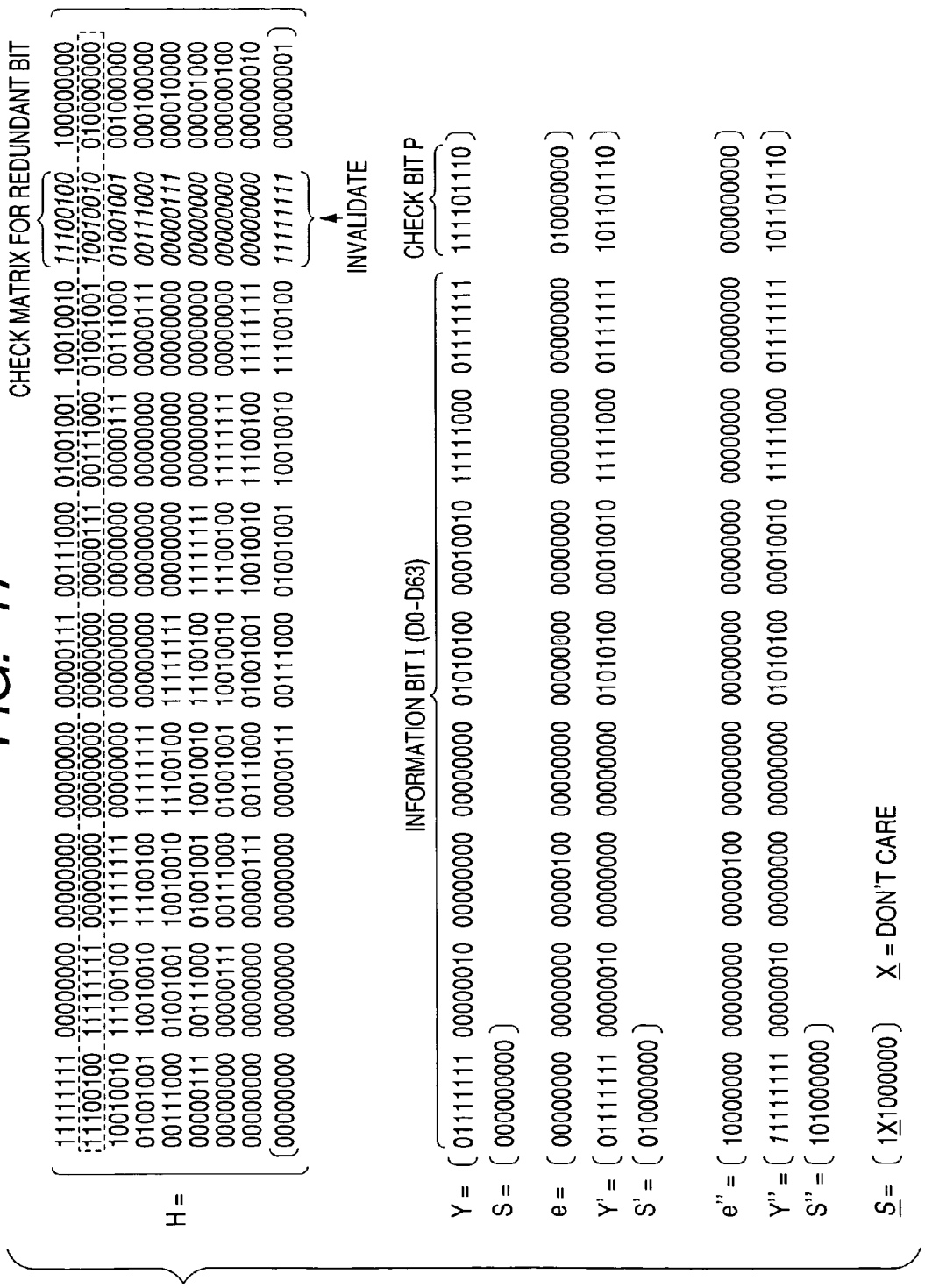
FIG. 17 is a diagram showing an example of: a check matrix used for a circuit to detect and correct an error in check bits; and a syndrome generated by using it, as the third embodiment.
Figure 18:
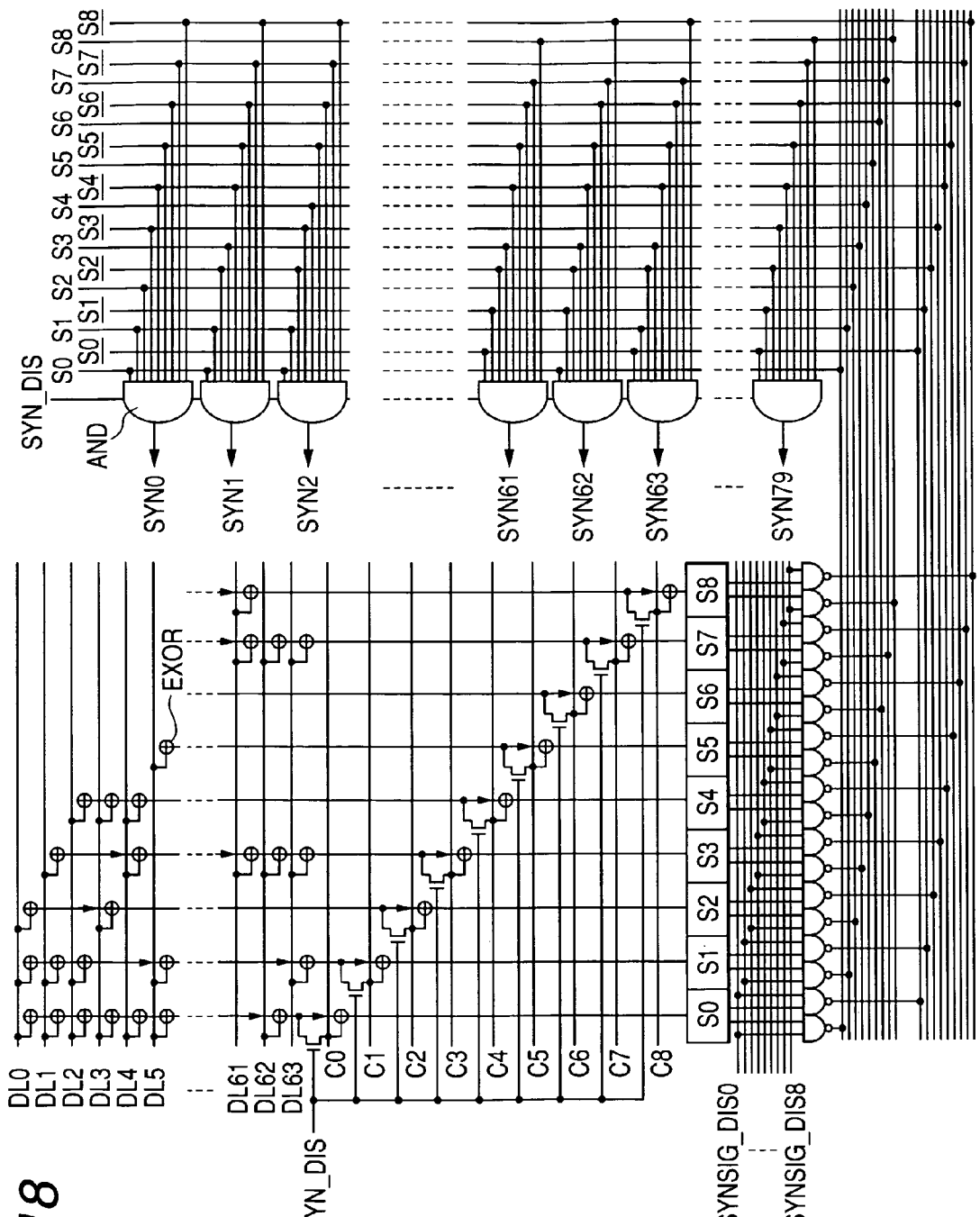
FIG. 18 is a diagram showing an example of an error correcting code circuit composed by using the check matrix shown in FIG. 17.
Figure 19:
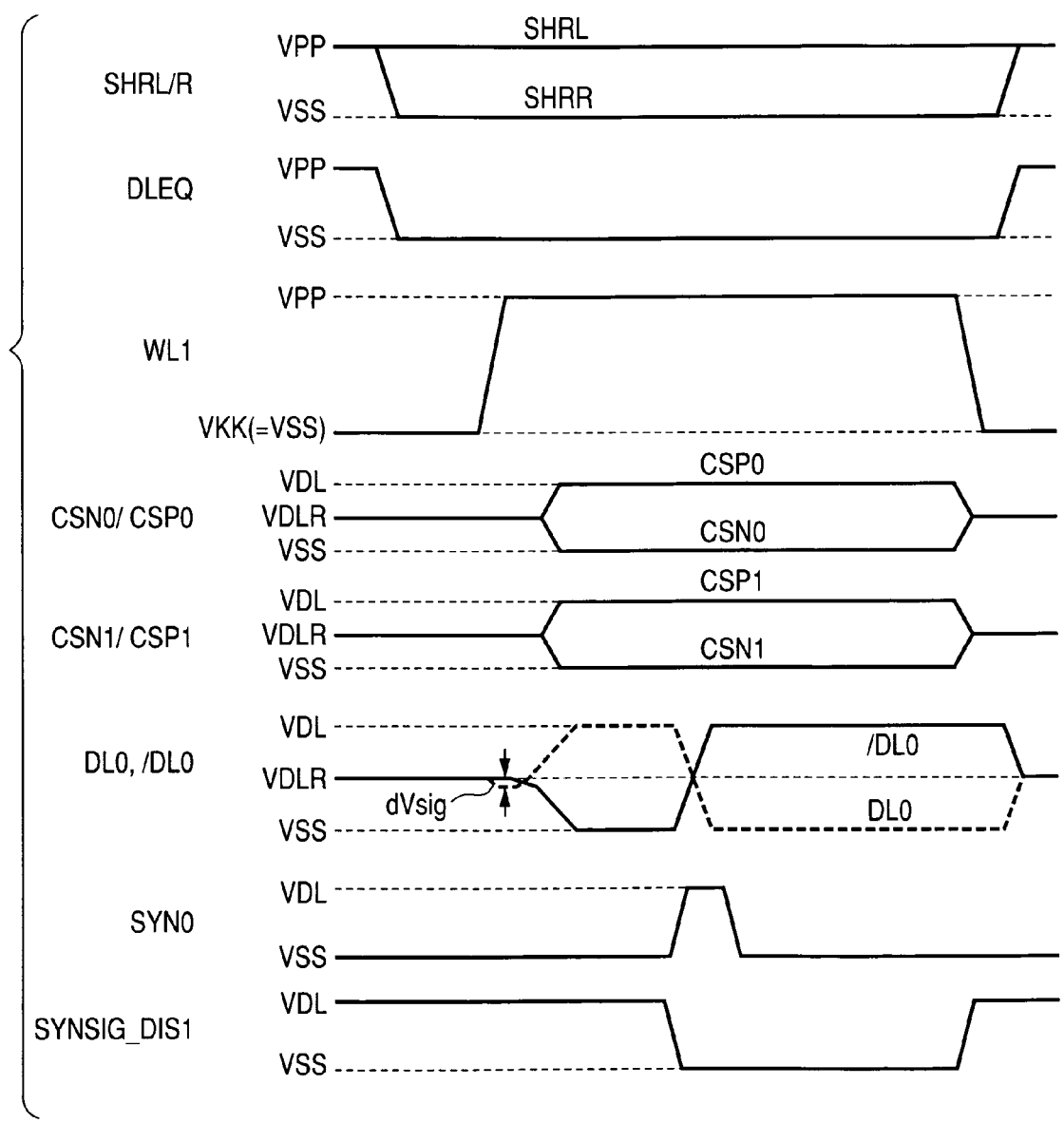
FIG. 19 is a diagram showing an example of readout operation waveforms when the error correcting code circuit shown in FIG. 18 is used.

FIG. 1 is a conceptual diagram showing a memory array wherein an error correcting code circuit as the first embodiment according to the present invention is disposed on each of the sub-array blocks. FIG. 2 is a diagram showing an example of operation sequence from the generation of a syndrome to the detection and correction of an error in an error correcting code circuit as the first embodiment according to the present application. FIG. 3 is a diagram showing an example of the operation sequence of sub-circuits at the time of activation in the operation sequence shown in FIG. 2. FIG. 4 is a diagram showing an example of the operation sequence of sub-circuits at the time of precharge in the operation sequence shown in FIG. 2. FIGS. 5 and 6 are diagrams each of which shows an example of each circuit structure to realize the block configuration shown in FIG. 1. FIG. 7 is a diagram showing an example of a check matrix used in the case shown in FIG. 1. FIG. 8 is a diagram showing a concrete example of an error correcting code circuit in each of the plural sense amplifier arrays SAAs shown in FIG. 5. FIG. 9 comprises diagrams showing examples of the exclusive OR circuit shown in FIG. 1. FIG. 10 comprises diagrams showing concrete examples of the AND circuit which is a part of the error correcting code circuit shown in FIG. 8. FIG. 11 is a diagram showing an example of readout operation waveforms in the error correcting code circuit shown in FIG. 5. FIG. 12 is a diagram showing an example of writing operation waveforms in the error correcting code circuit shown in FIG. 5. FIG. 13 is a diagram showing an example of a DRAM chip comprising an error correcting code circuit according to the present embodiment. FIG. 14 is a diagram showing an example of a check matrix used for the generation of a syndrome when an error correcting code circuit is configured by adding a new exclusive OR circuit for redundancy as the second embodiment. FIG. 15 is a diagram showing an example of a sub-array circuit to which an error correcting code circuit according to the second embodiment of the present invention is added. FIG. 16 is a diagram showing an example of readout operation waveforms in the error correcting code circuit shown in FIG. 15. FIG. 17 is a diagram showing an example of a check matrix used for the generation of a syndrome when an error correcting code circuit is configured by further adding an exclusive OR circuit to the error correcting code circuit shown in FIG. 15 as the third embodiment. FIG. 18 is a diagram showing a concrete example of an error correcting code circuit composed by using the check matrix shown in FIG. 17. FIG. 19 is a diagram showing an example of readout operation waveforms in the error correcting code circuit shown in FIG. 18. FIG. 20 is a table showing an example of the constants regarding transistors and capacitors in memory cells and sense amplifiers in the cases of 65 nm nodes and 45 nm nodes.

First Embodiment

Firstly, the first embodiment according to the present invention is hereunder explained based on FIGS. 1 to 13. FIG. 1 is a conceptual diagram showing a memory array wherein an error correcting code circuit ECC as the first embodiment according to the present invention is disposed next to a sense amplifier SA, namely for each sub-array block SAB. The reference characters in the figure are as follows: SWD represents a sub-word driver to drive word lines, SARY a memory cell array in which data is stored, CHKARY a check bit array in which information for checking the existence of an error in data in the memory cell array SARY is stored, X a codeword composing one check unit, and ECC one-bit error correcting code circuit to detect and correct an error based on the data and information read out from a memory cell ARY and the check bit array CHKARY. Here, the following embodiments, unless specifically described otherwise, are based on the premise that data is read out in 64 bit units from a memory cell array SARY to a sense amplifier SA and, in compliance with that, check bits composed of 8 bits are read out to the sense amplifier SA.

FIG. 2 shows an operation sequence of the memory array shown in FIG. 1. When an external command for activation is input, the following processes advance sequentially: (1) activation of a word line, (2) signal development across a data line, (3) amplification of a read signal voltage on the data line with a sense amplifier SA, and (4) correction of latched data in the SA circuit with an ECC circuit. Here, the process different from the operation sequence of a conventional DRAM is (4) correction of latched data in the SA circuit with an ECC circuit. Further, when the external commands of read and write are input, the following processes advance sequentially: (1) activation of a column select line and (2) determination of intended I/O data with the sense amplifier SA. At the time of precharge operation, the following processes advance sequentially: (1) generation of check bits P with the ECC circuit, (2) data writing to a memory cell, (3) deactivation of the word line, and (4) precharge of the data line. Note that, the precharge operation is carried out: continuously from a read/write command in the case where the read/write command is the one that indicates that the precharge is automatically carried out after the end of the read/write operation; or at the time when the precharge command is input in the case where the read/write command is the one that indicates that the word line is maintained in the activated state after the read/write operation. Here, the process different from the operation sequence of a conventional DRAM is (1) generation of check bits P with the ECC circuit. As stated above, by operating the error correcting code circuit ECC in the operation sequence shown in FIG. 2, the operations of data readout, error detection and correction, and external data writing are processed in a so-called row cycle time. That is, the processes of outputting data in a sub-array SARY up to the exterior of a bank and checking and correcting an error at the time of ordinary writing operation, which processes have been required in the configuration of such an error correcting code circuit as disclosed in JP-A No. 56671/2002 and others, are not required any more and therefore it is possible to inhibit to the minimum the read/write speed from lowering. As a consequence, a memory wherein the detection and correction of an error do not cause an access speed to drastically lower can be realized and further malfunctions can be prevented even when the voltage of the data line is lowered and therefore the power consumption can be reduced. Further, since it is not required to output data to the exterior of a bank, it is not necessary to amplify many I/O lines having large parasitic capacitances. Namely, it becomes possible to suppress to the minimum the increase of the electric current consumed during operation caused by adding an ECC circuit.

FIG. 3 is a diagram showing an example of the operation sequence of sub-circuits at the times of the activation and read/write in the operation sequence shown in FIG. 2. The error correcting code circuit ECC is composed of 72 sub-circuits and they are shown as the reference characters ECC0 to ECC71 in the figure. Each of the ECC sub-circuits mainly comprises an exclusive OR circuit EXOR, a comparison circuit COMP, and a data inverting amplifier circuit DINV. When a sense amplifier SA0 connected to the ECC sub-circuit ECC0 wrongly reads out data at the time of the activation (1), firstly the data is input into the exclusive OR circuit EXOR and the output result is input into the subsequent exclusive OR circuit EXOR composing the ECC sub-circuit ECC1 (2). Likewise, the ECC sub-circuit ECC1 calculates the exclusive OR of the output result of the ECC sub-circuit ECC0 and the data of the sense amplifier SA1 and the output result is transferred to the subsequent ECC sub-circuit ECC2. Such calculation is carried out sequentially, thus the exclusive OR EXOR is calculated for 72 steps, and resultantly a syndrome signal S of 8 bits is produced. If a readout error is detected and the syndrome signal S is activated (in this case, if even one bit is output among the 8 bits in the syndrome signal S), the syndrome is pre-decoded in the pre-decode circuit PD (3) and whether or not the decoded syndrome signal S agrees with the sense amplifier circuit SA is judged in the comparison circuit COMP (4). Further, the data inverting amplifier circuit DINV inverts the data in the sense amplifier circuit SA0 (5), thereafter the column switch YSW is activated, and correct data is read or written. Those are the operation sequence from the activation to the read/write.

Next, the operation sequence regarding precharge is explained with FIG. 4. When there is an error in readout data at the time of activation, the error correcting code circuit ECC detects and corrects the error and thereafter the data to be read or written is stored in the sense amplifier SA. Thereafter, (1) the data stored in the sense amplifier SA activates the column switch YSW and thereby (2) is output or input to the exterior. In this case, when a write command is input from the exterior, it is necessary to newly produce check bits P to detect and correct the error for a new data pattern of 64 bits. In order to generate the new check bits P, (3) the exclusive OR EXOR is calculated with the data stored in the sense amplifier SA and the same processes as employed at the time of the activation are carried out. Note that, as it will be described later, when the check bits P are calculated, the check bits P may be calculated by using the exclusive OR EXOR belonging to the sub-circuits of ECC0 to ECC63 in the ECC block ECC0 to ECC71 that composes a check code H. Thereafter, the generated check bits P and the data stored in the sense amplifier SA are restored in memory cells and successively the word line is deactivated and the data line is precharged. Thus the error detection and correction are carried out in a row cycle time from the activation through the read/write to the precharge command.

FIG. 5 is a diagram: showing an embodiment of a DRAM on which an error correcting code circuit according to the present invention is mounted; and describing sense amplifier arrays SAA0-SAA71 each of which comprises a syndrome generating circuit SYN_GEN comprising plural exclusive OR circuits EXORs, a data inverting amplifier circuit DINV, a sense amplifier circuit SA, a precharge circuit PCH, and a column switch YSW. Here, the comparison circuit COMP is omitted to avoid the complication of the drawing. Further, the sub-array SARY0 having plural memory cells MCs each of which comprises an access transistor TN and a cell capacitor CS is connected to the sense amplifier arrays SAA0-SAA63 through switch transistors TSWs. Further, sub-word drivers SWDs to drive word lines WLs of the memory cells MCs are connected to both sides of the sub-array SARY. Furthermore, a check bit array CHKARY0 to store the check bits necessary for the detection and correction of an error is connected to the sense amplifier circuits SAA64-SAA71 and composes a memory array. Here, the memory cells to store the check bits have the same configuration as the memory cells MCs composing the sub-array. The memory cells to store the check bits are connected to the same word line WL as the relevant memory cells MCs are connected to. Thereby by activating one word line WL, both the relevant memory cells MCs and the memory cells to store the check bits are read out simultaneously and hence the control is facilitated in comparison with the case of incorporating check bits into a different memory array. Here, the error correcting code circuit ECC is composed of a syndrome generating circuit SYN_GEN, a data inverting amplifier circuit DINV, and a comparison circuit COMP which will be described later. Here, though the detailed configuration and operation are described later, the syndrome generating circuit SYN_GEN and the after-mentioned comparison circuit COMP take the role of detecting an error when data is read out from the relevant memory cells and the data inverting amplifier circuit DINV takes the role of inverting and correcting the data of the readout error detected by the syndrome generating circuit SYN_GEN and the after-mentioned comparison circuit COMP.

The other reference characters are as follows; CSN0 and CSP0 represent common source lines to drive the sense amplifier circuit SA, ΦCSN0, ΦCSN1, ΦCSP0 and ΦCSP1 common source drive signals, CSN1 and CSP1 common source lines to drive the data inverting amplifier circuit DINV, INV_SIG a data inverting signal, SHRR and SHRL switch transistor drive lines, YS0 a column switch drive line, LIOT0, LIOB0, LIOT1 and LIOB1 local data lines, DLEQ a precharge drive line, VDLR a precharge voltage, WL and WL0-WL2 sub-word lines, DL0 and /DL0 data lines, TN an access transistor, CS a cell capacitor, PLT a plate electrode, S0-S7 syndrome signals, and SYN0-SYN71 data correction signals. Note that, each of the plural memory cells MCs is a DRAM memory cell equipped with an N-type channel MOS transistor TN and a capacitor CS, respectively. Further, each of the plural sense amplifier circuits SAs is composed of a pair of P-type channel MOS transistors wherein the gate of one transistor is connected to the drain of the other transistor and a pair of N-type channel MOS transistors wherein the gate of one transistor is connected to the drain of the other transistor.

As shown in FIG. 5, the syndrome generating circuit SYN_GEN and the after-mentioned comparison circuit COMP are disposed for each sub-array SARY. By adopting such a configuration, it is possible to process the operation of the readout of data, the detection and correction of an error, and the writing of external data with the sense amplifier array SAA. That is, since it is not necessary to output data in the sub-array SARY up to the exterior of a so-called bank at the time of ordinary writing operation, it is possible to inhibit to the minimum the reading and writing speeds from lowering even when the error detection and correction operation is carried out. Here, in a test mode, the data inverting amplifier circuit DINV can be invalidated by negating the data inverting signal INV_SIG composing the data inverting amplifier circuit DINV shown in FIG. 5 and thus the operation related to the error detection and correction is also invalidated. As a consequence, by reading out the data before correction in the memory cells in the sub-array SARY, it is also possible to analyze the poor fixation caused by a foreign substance, poor retention and the like, and thus to evaluate the yield of a chip.

FIG. 6 shows plural sub-array blocks so as to clarify the allocation of each circuit in the embodiment shown in FIG. 5. A sub-array SARY including a sub-array SARY and a check bit array CHKARY is formed in a quadrangular region and the sense amplifiers SAs and the error correcting code circuits ECCs are disposed along the right and left sides thereof. Further, sub-word drivers SWDs are disposed along the upper and lower sides of the quadrangular region. Here, the sense amplifiers SAs and the error correcting code circuits ECCs are disposed so as to be commonly connected to the sub-arrays SARYs disposed on the right and left sides thereof. Likewise, the sub-word drivers SWDs are disposed so as to be commonly connected to the sub-arrays SARYs disposed on the upper and lower sides thereof. Furthermore, the sense amplifiers SAs are alternately disposed on the right and left sides of pairs of bit lines (BLTs and BLBs). Thereby, it becomes possible to reduce the areas of the error correcting code circuits ECCs, the sense amplifiers SAs, and the sub-word drivers SWDs. The data read out by a sense amplifier SA is output to a local I/O line LIO through a column switch YSW. The data is further output to a main I/O line MIO through a switch in the node region XP. Here, to the local I/O line LIO and the main I/O line MIO, the data the error of which has already been corrected in an error correcting code circuit ECC is output. That is, since it is not necessary to drive the local I/O line LIO and the main I/O line MIO every time an error is corrected, a high-speed low power consumption operation can be realized. Here, in the present embodiment, the number of the memory cells connected to a word line WL in the memory cell array is 144 (bits) that is the double of the bit number (72 bits) required for error correction.

FIG. 7 shows an example of a check code H, namely a (72, 64) hamming code, which is a concrete example of syndrome generation in the syndrome generating circuit SYN_GEN described in the embodiment shown in FIG. 5. Here, the reference characters I and I" represent information bits, X and X" codewords, P and P" check bits, Y and Y' received words, and S and S' generated syndromes. As shown in FIG. 7, for example, the check bits P corresponding to the codeword X are obtained by multiplying the generating matrix G by the transposed matrix IT of the information bits I. Here, the computation is performed by mod2. Hence, when data has no error, the received word Y is expressed by the matrix (codeword X) of 72 bits obtained by adding the check bits P to the information bits I. Here, in FIG. 7, the syndrome S computed from the check code H and the transposed matrix YT of the received word Y is zero in all bits. That means that the received word Y has no error. On the other hand, it is assumed that single error e occurs and the received word Y' is expressed by the expression Y'=Y+e (here, the sign "+" means an exclusive OR). In this case, the syndrome S' generated during the processes of error detection and correction becomes S'= (11100000). The generated syndrome S' has the information of the bit address where the single error occurs. Hence, it is detected that the data of D0 corresponding to the first column H0 (11100000) of the check matrix H is wrongly read out. Here, the information bits I and I" in the codewords X and X" shown in FIG. 7 are stored in memory cells in the sub-array SARY. Further, the data of the check bits P and P" is stored in memory cells in the check bit array CHKARY. The numeral "1" in the matrix of the check code H means the physical address of the exclusive OR EXOR shown in FIG. 8 to be described later. Meanwhile, the received words Y and Y' show the signals on the data line when the codewords X and X" stored in the sub-array SARY are read out from the memory cells and amplified by the sense amplifier SA.

FIG. 8 shows: a syndrome generating circuit SYN_GEN wherein the check matrix H shown in FIG. 7 is composed of plural exclusive OR circuits EXORs and plural AND circuits ANDs; and a comparison circuit COMP. Meanwhile, although the example of using a pre-decoder PD and each of the comparison circuits COMPs is described in FIG. 3, in order to simplify the explanation here, an example of directly comparing a generated syndrome signal S and the number showing the address of each sense amplifier (each column H0-H71 of the check matrix H) is described. The reference characters in the figure are as follows; C0-C7 represent check bit output lines, SYN_DIS a syndrome disabling signal, and COMP a comparison circuit. The other reference characters are identical to those in FIG. 1 and hence the explanations are omitted. AS an example, when the received signal Y' in FIG. 7 where single error e occurs is input to the syndrome generating circuit SYN_GEN via the data lines DL0-DL63 and the check bit output lines C0-C7, the generated syndrome S' is expressed by S'=(11100000). Hence, only the data correction signal SYN0 is asserted among the data correction signals SYN0-SYN71. As a consequence, the data inverting amplifier circuit DINV is activated by asserting the data correction signal SYN0 to the high level and the data can be corrected by inverting the signal wrongly read out on the data line DL0.

Figure 9A:
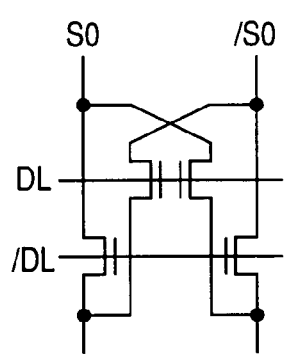
FIGS. 9A, 9B, and 9C are diagrams showing examples of the exclusive OR circuit shown in FIG. 8.
Figure 9B:
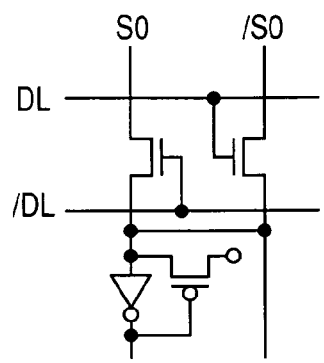
Figure 9C:
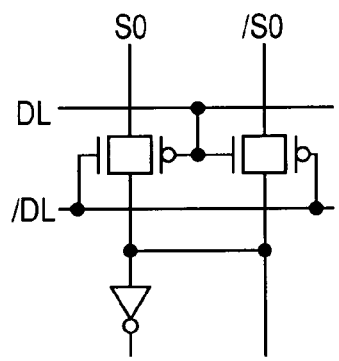

FIG. 9 shows concrete examples of an exclusive OR circuit EXOR shown in FIGS. 5 and 8. The circuit shown in FIG. 9A is composed of four NMOS transistors and hence has the advantage that the circuit has a small area. The circuits shown in FIGS. 9B and 9C are composed of CMOS type circuit structures and have the advantage that they can be operated at a high speed though the circuit areas are somewhat larger than that in the case shown in FIG. 9A. FIG. 10 comprises circuit diagrams showing concrete examples of an AND circuit AND shown in FIG. 8. Since the AND circuit AND deals with the logical product of eight inputs, in FIG. 10A, the example of connecting seven AND circuits and forming an AND circuit of eight inputs is shown as an example. Meanwhile, the syndrome disabling signal SYN_DIS is connected to the power supply of the AND circuits ANDs and controls the data correction signal SYN0. As a consequence, the circuit composing the error correcting code circuit ECC of the present embodiment can be configured with a simple circuit and can be realized easily. Meanwhile, FIG. 10B shows an example of a dynamic type AND circuit AND wherein pass transistors are serially connected. In this case, the number of the transistors composing the AND circuit AND can be decreased and hence a highly integrated DRAM array can be realized.

FIG. 11 is a diagram showing an example of the operation waveforms when data is read out with the error correcting code circuit ECC according to the present invention. Firstly, the precharge drive line DLEQ is asserted and a pair of data lines are precharged to a precharge voltage VDLR. There are several kinds of methods as the methods of driving the precharge drive line DLEQ and the method of using, for example, a row address signal and a sub-array selection signal may be adopted. Likewise, the switch transistor drive line SHRR is negated by using a row address or the like. Thereby, the pair of data lines of the selection sub-array SARY0 are electrically connected to the sense amplifier arrays SAA0-SAA71. Next, when the sub-word line WL1 is asserted, the stored signal is output from plural selection memory cells to the data line. For example, a very small signal dVsig corresponding to the L level of the memory cells MCs shown in FIG. 5 is output to the data line DL0. Thereafter, when the common source line CSN0 is driven to the ground voltage VSS, the data line DL0 is driven to the ground voltage VSS if an error does not exist in the readout data. However, in the case where miniaturization advances and the capacity of a cell capacitor is secured insufficiently, if the voltage of the data line is lowered, the aforementioned read signal dVsig becomes very small. In such a case, by the influence of α rays, neutron rays irradiated from space and the like for example, sometimes a critical charge occurs and the data of the read signal dVsig output to the data line is inverted. In such a case, as shown with the broken line in FIG. 11, the data line DL0 to be driven to the ground voltage VSS is driven to the high level voltage VDL and the data is wrongly read out. In contrast, by installing an error correcting code circuit ECC as indicated in the present invention, the signal on the data line DL0 which is wrongly read out can be corrected. For example, when the data on the data line DL0 is wrongly read out like the received signal Y' in the same way as the operation waveforms shown in FIG. 11, the output syndrome signals S0-S7 are expressed by the expression S'=(11100000). As a consequence, the data correction signal SYN0 is asserted to a high level, the data inverting amplifier circuit DINV is activated, the voltage level maintained by the data inverting signal INV_SIG is inverted, and the data on the data line DL0 is corrected. Thereafter, the column switch YSW is activated and the corrected signal is output to the exterior.

FIG. 12 is a diagram showing an example of the operation waveforms when an error correcting code circuit ECC according to the present invention is used and data is written from the exterior. The basic operation is identical to that in FIG. 11 and hence detailed explanation is omitted. Further, some control lines such as a switch transistor drive line SHRR and the like are also omitted for the simplification of the explanation. The point different from the case of FIG. 11 is that the syndrome disabling signal SYN_DIS is asserted to a high level after correcting the data of DL0 by using the data correction signal SYN0. When the data of two bits of DL8 and DL9 shown by the underline, of the information bits shown in FIG. 7, is written from the exterior for example, firstly the sub-word line WL1 is asserted and intended data is read out from memory cells. On this occasion, when the data of DL0 is wrongly read out in the same way as shown in FIG. 11, the data on the data line DL0 is corrected by the error correcting code circuit ECC. Thereafter, the column switch drive line YS4 is activated and the external data is input to the data lines DL8 and DL9. Next, the syndrome disabling signal SYN_DIS is asserted and the generated data of the check bits P''' is output to each of the check bit output lines C0-C7. Further, the AND circuit AND is invalidated by using the syndrome disabling signal SYN_DIS. Thereby, it is possible to correctly generate the check bits P''' corresponding to the information bits I''' which is the data to write. In addition, it is possible to control the error correcting code circuit ECC so as not to wrongly correct the information bits I''' which are the data to write and the newly generated check bits P'''. In this way, after the error correcting code circuit ECC is controlled with the syndrome disabling signal SYN_DIS, the column switch YS4 is asserted and the writing data DQ is written into memory cells via the data line DL8. Further, the generated check bits P''' are written into the intended memory cells for check bits. As a consequence, it is possible to activate the syndrome disabling signal SYN_DIS, thereby to correctly control the error correcting code circuit ECC, and thus to realize a DRAM array allowing low voltage operation. Meanwhile, although the syndrome disabling signal SYN_DIS is used as the signal to control the writing of the check bits, it is also acceptable to control the writing operation of the check bits with another signal controlled by an external precharge command. Thereby, when writing operation is continuously required for memory cells connected to the same word line, it is not necessary to write newly generated check bits into the memory cells of the check bit array CHKARY every time when external data is written into a data line via the column switch YSW. Therefore it is possible to reduce the data line charge and discharge current of the check bit array CHKARY and thus to reduce the power consumption.

FIG. 13A is a diagram showing an example of a DRAM chip configured with error correcting code circuits ECCs according to the present invention. The reference characters in the figure are as follows; CHKARY represents a check bit array, ECCSA an ECC sense amplifier section, SARY a sub-array, SWDA a sub-word driver, R-DEC a row decoder, C-DEC a column decoder, A-CTL an address controller, PERI a peripheral circuit, PAD a pad, V_GEN an on-chip voltage generator, and DETECT an ECC detection section. Here, in order to avoid the cumbersomeness of the figure, some parts of the circuit block, such as a main word driver and the like, required for a chip are omitted in the figure. Since an error correcting code circuit ECC is incorporated into an ECC sense amplifier section ECCSA as stated above, it is not necessary to change the configuration of peripheral circuits such as a row decoder R-DEC and the like and thus the design work is facilitated. Meanwhile, FIG. 13B is an example of a diagram showing the relationship of the connection between various power source voltages generated by an on-chip voltage generator V_GEN and each of the circuits using such power sources. The on-chip voltage generator V_GEN produces the voltage levels including a word line selective level VPP, a word line nonselective level VKK, a data line voltage VDL, a ground voltage VSS, a periphery circuit voltage VCL, a substrate voltage VBB, and a precharge voltage VDLR by using an external power source VDD and an external ground power source GND. Each circuit carries out intended operation related to reading and writing by using those voltage levels. A row address ROW_ADD, a column address COL_ADD, and a data code correction signal SYN are input into the ECC detection section DETECT in FIG. 13C. Further, an ECC acknowledge signal ECC_ACK which is a signal to detect that an error is corrected and to broadcast the existence or not of the detection to an exterior system is described. Here, the ECC acknowledge signal ECC_ACK can be transferred to the exterior system by adding a new dedicated pad PAD_ECC shown by the hatching in the pad section in FIG. 13A. Here, the dedicated pad PAD_ECC is connected to an output circuit to output the ECC acknowledge signal ECC_ACK. In the case of an existing DRAM, an address pad and a data I/O pad are separately disposed above and below relative to the center axis in the direction of the ling side of a semiconductor chip. In such a case where an address pad and a data I/O pad are separately disposed above and below as stated above, by disposing the dedicated pad PAD and the output circuit on the side where the data I/O pad is disposed, it is possible to connect the power sources VSSQ and VDDQ for data I/O commonly to the ECC acknowledge signal output circuit and thus the wiring can be simplified and the required area can be reduced. Furthermore, by configuring a semiconductor chip so as to output an ECC acknowledge signal as stated above, it becomes possible to always monitor the reliability of memory cells after the chip is fabricated. For example, by storing log showing that an error correcting code circuit has been operated in an external system and monitoring the frequency of error generation, it is possible to always monitor the reliability of a chip. As a consequence, by disposing an error correcting code circuit ECC and an ECC detection section DETECT according to the present invention, it is possible not only to lower electric power consumption but also to remarkably improve the reliability of the entire system.

The above explanations are those of the first embodiment according to the present invention. Here, it goes without saying that the configurations shown in FIGS. 1 to 13 may be modified variously within the range not deviating from the tenor of the present invention. For example, although the folded bit line arrangement is shown in FIG. 5, an open bit line arrangement can surely be employed. Further, needless to say, the sense amplifier circuit SA may also take not the circuit arrangement of a latch type but such a circuit arrangement as a so-called direct sense amplifier. In this case, the only thing to do is to newly add a transistor for data writing. Furthermore, any of the following drive methods may be adopted: a sense amplifier drive method of a so-called overdrive system, wherein the voltage of the common source lines CSP0 and CSP1 is raised up to the voltage of the peripheral circuits VCL; a so-called distributed drive method wherein driver circuits to drive the common source lines are disposed in a distributed manner; and a so-called a distributed overdrive method wherein the above two methods are combined. In any of the cases, data in memory cells can be read out at a high speed even when a lower voltage is employed. Furthermore, the check matrix H shown in FIG. 7 can also be modified variously. Any check matrix is acceptable as long as a unique bit pattern can be configured at each column. Furthermore, although the hamming code is used for the simplification of the explanation in the example shown in FIG. 7, the present invention is not limited to the hamming code. A so-called BCH (Bose-Chadhuri-Hocquenghem) code may be used or the check matrix may be configured by using a Reed-Solomon code. As stated above, an error correcting code circuit ECC can be realized by various coding means. In addition, although the embodiments of the error correcting code circuit ECC, the exclusive OR circuit EXOR, and the AND circuit AND are described in FIGS. 8 to 10, the present invention is not limited to those and may be modified variously. Here, when a cyclic hamming code is used instead in the case shown in FIG. 7, it is also possible to drastically reduce the size of the circuit by repeatedly using an exclusive OR circuit EXOR. Since such modification can be realized by adding a generally available circuit, no drawing is shown here. Further, it goes without saying that the timing of the operation waveforms shown in FIGS. 11 and 12, and the configuration of the DRAM chip, the number of sub-arrays SARYs, and the configuration of the ECC detecting section shown in FIG. 13 can also be modified within the range not deviating from the tenor of the present invention.

Second Embodiment

In the first embodiment, when a readout error is produced, the wrongly readout data is corrected with an error correcting code circuit ECC. However, by means of adding redundant bits and replacing a defective bit with a redundant bit, the voltage can be lowered further than the case of not having redundant bits. As a consequence, a more reliable DRAM array can be realized.

The check matrix H shown in FIG. 14 is an embodiment of a check matrix wherein redundant bits are added to a sub-array SARY and a check matrix for redundant bits corresponding to the added redundant bits is newly added. As far as an additional check matrix is stored for redundant bits as stated above, even in the case where memory cells connected to the data lines DL8 and DL32 are defective for example, by selecting a matrix of four columns from among the check matrix for redundant bits in order to detect and correct the error on the data line of the replaced redundant bits, even when the data of the replaced redundant bits is wrongly read out, the data can be corrected. Note that, since the check matrix H is configured beforehand so that all the columns are formed into independent bit patterns, even if arbitrary columns are selected from the check matrix for redundant bits, they can be used as a check matrix for an error correcting code circuit. The example shown in FIG. 14 shows that one cell is the defective cell among the plural memory cells connected to the data lines DL8 and DL32 and that the sense amplifier arrays SAA8, SAA9, SAA32 and SAA33 connected to the column switches YS4 and YS16 to select the data lines DL8 and DL 32 are replaced with the sense amplifier arrays for redundant bits and the redundant bits, respectively. Note that, in the check matrix corresponding to the data lines of the bits to be replaced, the 8th, 9th, 32nd and 33rd columns and the matrix of the four columns shown by the italic numerals corresponding to unused redundant bits must be invalidated during error detecting and correcting operation. The reason is that, without invalidation, correct check bits P conforming to the information bits I of 64 bits cannot be generated. As a consequence, the check matrix formed by replacing a defective bit with a redundant bit is shown as a check matrix H' formed by excluding the invalidated bit pattern and, by using the check matrix H' of the present embodiment, it becomes possible to realize: a DRAM array using the redundant bits and the error correcting code circuit ECC in combination; and a memory allowing a lower voltage operation than the first embodiment wherein only the error correcting code circuit ECC is used. For example, in the case where the information bits I are as shown in FIG. 14, the received word is expressed by Y. In this case, since the received word Y has no error, all of the bits of the syndrome S are zero. On the other hand, in the case where single error e is produced and the received word is expressed by Y', the syndrome is output as S', the bit corresponding to the data line DL21 is detected being defective, and the data in the cell is corrected.

FIG. 15 shows an embodiment of the sense amplifier arrays SAA0-SAA79 when a circuit to invalidate an unnecessary bit pattern is added in the check matrix H' shown in FIG. 14. As shown in FIG. 15, by: connecting transistors so as to short-circuit the common source lines CSN0 and CSP0 of the sense amplifier circuit SA and the data lines DL and /DL; and asserting the sense amplifier disabling signal SADIS corresponding to the sense amplifier array connected to a defective memory cell, it is possible to deactivate the exclusive OR circuit EXOR. That is, a DRAM array using redundant bits and an error correcting code circuit ECC in combination can be realized. Further, by furnishing a data inverting amplifier circuit DINV with a data inverting signal INV_SIG in the same way as the first embodiment, it is also possible to invalidate the data inverting amplifier circuit DINV at the time of a test mode and to subject the sub-array SARY and the redundant cell to defect analysis. As a consequence, it is possible to identify which memory cell is defective and to replace an ECC block with the redundant bits based on the information, and therefore it becomes possible to provide a highly reliable chip.

FIG. 16 is a diagram showing an example of the operation waveforms of error detection and correction at the time of readout in the configuration shown in FIGS. 14 and 15. The basic operation is the same as the first embodiment and hence detailed explanation is omitted. Further, some control signals such as a data inverting signal INV_SIG and others are also omitted in order to simplify the explanation. The point different from the case shown in FIG. 11 is to assert a sense amplifier disabling signal SADIS4 and to fix the voltage level of the intended data lines DL8 and /DL8. In FIG. 16, it is shown that, since the memory cell connected to the data line DL8 is defective and replaced with a redundant bit, the sense amplifier circuit SA composing the sense amplifier array SAA8 is invalidated and the exclusive OR circuit EXOR is deactivated. Here, in the case of writing operation, it is required only to control the sense amplifier disabling signal SADIS shown in FIG. 16 in the same way as the case of the readout operation in addition to the operation waveforms shown in FIG. 12, and hence explanation based on drawings is omitted. As a consequence, by adding a sense amplifier disabling signal SADIS, it becomes possible to realize a DRAM array using redundant bits and an error correcting code circuit ECC in combination. That is, by having redundant bits, it becomes possible to secure more stable readout operation and to realize a DRAM array that does not cause errors even when the voltage of a data line is lowered. In addition, since the error correcting code circuit ECC is disposed on each sub-array SARY in the case of the present embodiment, it is possible to inhibit to the minimum the reading and writing speed from lowering in the same way as the first embodiment even at the time of ordinary operation.

Third Embodiment

In the first and second embodiments, the explanation has been done in the case where a memory cell of a check bit array is not defective. In contrast, when a memory cell of a check bit array has a defective cell capacitor or the like, by preparing beforehand additional plural check bits and a check matrix necessary for the detection and correction of an error in the check bits and using both the check bits and the check matrix for the detecting and correcting operation of the error, it is possible to correct the error data and to realize a highly reliable DRAM array even when a defective cell exists in the check bits and simultaneously an error is produced in the data read out from a sub-array SARY. In other words, even in the case of using a simple hamming code, it becomes possible to correct two bits; one hard error bit in check bits and one soft error bit in the data read out from a sub-array SARY. As a consequence, even when a data line is operated at a low voltage, it is possible to correct two bits, thus to secure stable readout, and to realize a DRAM array of low power consumption.

FIG. 17 is a diagram showing, assuming that a memory cell in a check bit array CHKARY is defective, an embodiment of a check matrix H to which a bit pattern to detect and correct the error in the defective check bit is newly added. FIG. 17 shows the example wherein the data line DL72 equipped with plural memory cells as check bits is added to the check bit array CHKARY and a check matrix is newly added in order to detect and correct an error of the data read out from the data line DL72. Thereby, it is possible to configure the check matrix H so that each column of the check matrix H forms an independent data pattern. Here, when a memory cell in the check bit array CHKARY is not defective, for example, the syndrome S for the received word Y is expressed as a signal of 9 bits all of which are zero. The case shows that there is no wrongly readout data. On the other hand, let's assume that there is a case where one of the memory cells composing a check bit array CHKARY and being connected to the data line DL65 cannot read out accurate data due to a defective cell capacitor. In this case, since an error of one bit is always produced, according to the error correcting means employed in the first and second embodiments, the error correcting capability is already consumed in the correction of the check bits and the readout error of the data in a sub-array SARY cannot be corrected. Hence, the present embodiment uses the data line DL72 of check bits prepared beforehand in the check bit array CHKARY for the detecting and correcting operation of an error. In other words, an error is detected and corrected by the configuration of not the (72, 64) hamming code but the (73, 64) hamming code. Thereby, it is possible to improve the data correcting capability of an error correcting code circuit ECC to the correcting capability of two bits in total comprising one hard error bit in the check bit array CHKARY and one soft error bit in the sub-array SARY. Note that, although FIG. 17 shows an example wherein an error is detected and corrected by adding the data line DL72 provided with plural memory cells as the check bits to the check bit array CHKARY, it surely goes without saying that a check matrix for redundant bits may be prepared for a defective cell in the sub-array SARY. In this case, the only thing to do is to use the part shown by italic numerals of the check matrix H shown in FIG. 17. By preparing redundant bits, a hard error in the sub-array SARY can be replaced and hence a more reliable DRAM array can be realized. That is, errors up to three bits on an identical data line can be corrected simultaneously. Here, if it is possible to operate at a sufficiently low voltage only with an error correcting code circuit ECC, the check matrix for redundant bits shown in FIG. 17 may not be required. In this case, the memory cells for redundant bits added to the sub-array SARY can be eliminated and thus a more highly integrated DRAM array can be realized. In this way, the embodiment according to the present invention can take various configurations in accordance with the object such as to secure high reliability and low voltage operation or to obtain a more highly integrated DRAM array. Further, although the explanation has been done based on the common sense amplifier configuration wherein four sense amplifier arrays SAAs are selected in total for one column switch YS in the first and second embodiments, in the present embodiment, the common sense amplifier configuration wherein two sense amplifier arrays SAAs are connected for one column switch YS is adopted for the simplification of the explanation. In addition, in the present embodiment, explanation is hereunder done based on the case where no defective cell exists in a sub-array SARY and the check matrix for redundant bits is not required to be used. Hence, the explanation is done based on the case where some parts of the check matrix H shown in FIG. 17 are invalidated and an error is detected and corrected.

It is assumed that single error e is produced and the data on the data line DL65 is wrongly read out as the received word Y' shown in FIG. 17. In this case, the syndrome S' is expressed by the expression S'=(010000000) and a hard error in the check bits is detected and corrected. Next, it is assumed that, in addition to the single error e caused by the hard error in the check bits, single error e' is produced due to malfunction when data in a sub-array SARY is read out as the received word Y". In this case, the syndrome S" is output as S"= (101000000). However, the check matrix which the syndrome S" shows does not exist in the check matrix H. That is, the error is detected but cannot be corrected. The reason is that one bit in the check bits is wrongly read out from the beginning and thus the capability of correcting one bit in the hamming code is exceeded. In the present invention therefore, when the address of the hard error in the check bits is already known, the syndrome signal corresponding to the hard error is invalidated. In the case of FIG. 17, if it is known that the memory cell connected to the data line DL65 is the hard error, the syndrome signal S1 is invalidated. Thereby, the syndrome S" is output as S=(1X1000000) (X means "don't care"). Hence, it is possible to show that the data line DL0 is wrong, and thus the error can be detected and corrected. That is, even when data in the check bit array CHKARY is wrong, the error in the sub-array SARY can be detected and corrected. Here, the check matrix H in the present invention is configured so that an independent bit pattern is maintained even when any row of the check matrix is in the state of "don't care." For example, the number of the numeral 1 in the rows of the generated matrix in FIG. 17 is three in every row and thus it is possible to always detect and correct an error even when any syndrome signal in the syndrome signals S0-S8 is invalidated.

FIG. 18 shows an example of an error correcting code circuit ECC provided with a means of invalidating a syndrome as described in the explanation of FIG. 17. The basic circuit configuration is the same as shown in FIG. 8 and hence detailed explanation is omitted here. The points different from the case shown in FIG. 8 are the two points that a syndrome disabling signal SYNSIG_DIS is added in order to invalidate a syndrome signal and that two double input NAND circuits are added to the nine bit syndrome signals S0-S8, respectively. By adopting such a configuration, an intended syndrome signal can be invalidated.

FIG. 19 shows an example of the operation waveforms when an error at readout is detected and corrected with an error correcting code circuit ECC according to the present embodiment. The basic operation is the same as the readout operation shown in FIGS. 11 and 16 and hence detailed explanation is omitted here. Further, some control signals such as a data inverting signal INV_SIG and others are also omitted for the simplification of the explanation. The point different from the cases shown in FIGS. 11 and 16 is that a syndrome signal disabling signal SYNSIG_DIS is asserted and the output data of the syndrome signal S1 is in the state of "don't care." By controlling the syndrome signal disabling signal SYNSIG_DIS0 as stated above, the syndrome S" can be output as the syndrome S. As a result, the data correction signal SYN0 is asserted and thus the data on the data line DL0 can be detected and corrected. Here, the circuit diagram of the sense amplifier array SAA is not shown in the present embodiment but is omitted here since it is the same as FIG. 15. Further, since the operation waveforms at the time of writing are basically the same as those in FIG. 12 and, in addition to that, only the addition of the syndrome signal disabling signal SYNSIG_DIS is required as shown in FIG. 19, the drawings and the explanation thereof are omitted here.

Here, a cyclic hamming code is used in the check matrix shown in FIG. 17. It is possible to repeatedly use an exclusive OR circuit EXOR by using the cyclic hamming code. As a result, it is possible to inhibit to the minimum the additional hardware from increasing and to realize a more highly integrated DRAM array. Note that, it goes without saying that, in the first and second embodiments too, by configuring the check matrix with a cyclic hamming code, it is possible to inhibit the increase of the area for additional hardware to the minimum. Here, modification for realizing a circuit wherein an exclusive OR circuit EXOR can repeatedly be used by using a cyclic hamming code can be obtained by adding a generally adopted circuit such as a resistor or the like and hence the drawings and the explanation thereof are omitted here. As a consequence, the present invention can variously be modified within the range not deviating from the tenor of the present invention.

AS explained above, by using an error correcting code circuit ECC explained in the first to third embodiments, it is possible to inhibit to the minimum the speed in the reading and writing of data from lowering in ordinary operation and further to inhibit consumed electric current from increasing since it is unnecessary to amplify the external I/O line of a sub-array. Further, even when the voltage of a data line is lowered and the amount of signals reduces, it is possible to accurately read out the signals. Here, a memory cell MC composing a sub-array SARY in the first to third embodiments, as explained in the DRAM cell of the single transistor type, may surely be a so-called twin cell of the double transistor type. Further, a so-called OR cell that uses two memory cells and produces the logical sum thereof may surely be used. Needless to say, a static random access memory of a six transistor type may also be employed instead of the DRAM cell and the combination of various memory cells and an error correcting code circuit according to the present invention may also be used. Further, although the case where the sub-word line WL is amplified from a ground voltage VSS up to the VPP voltage of a high level is described in the operation waveforms explained in the first to third embodiments, a so-called negative word method wherein the potential of the sub-ward line is negative in the non-selective state may also be used. In this case, the concentration of impurities in the substrate of a memory cell can be lowered and thus it is possible to solve such a problem that the data line voltage is not sufficiently written into an accumulation node. As a consequence, since the defective cells caused by the insufficient writing of the signal voltage can be reduced, a highly reliable DRAM array capable of securing stable readout operation, namely capable of outputting correct data even when the voltage of the data line is lowered, can be realized by using it in combination with an error correcting code circuit according to the present invention. As stated above, an error correcting code circuit according to the present invention may variously be modified in accordance with the object such as low voltage operation and higher integration.

Further, the present invention is particularly effective when the miniaturization advances up to a 65 nm node and a 45 nm node and the operation margin lowers. For example, when the lowering of the voltage advances in parallel with the miniaturization up to 65 nm and 45 nm nodes as shown in FIG. 20, there arise some cases where the amount of the read signals reduces and random-type defects increase. Likewise, when the memory cell capacity CS is 20 to 15 fF and cannot be secured sufficiently, there are some cases where the amount of the read signals reduces and the errors of readout operation increase. In contrast, by using an error correcting code circuit according to the present invention, it is possible to correct those errors and to read out correct data. Further, when the gate length Lg, the gate width W and the gate oxide film thickness Tox of peripheral circuits such as memory cells and sense amplifiers SAs are miniaturized as shown in FIG. 20, there arise some cases where so-called element unevenness such as the fluctuation of the threshold voltage increases by the short channel effect of a transistor or the like. The element unevenness such as the threshold voltage fluctuation and current leakage may cause the amount of read signals to decrease and, like the lowering of the data line voltage and the lack of the memory cell capacity, may lead to the error in the readout operation. In such a case too, by using an error correcting code circuit according to the present invention, it becomes possible to prevent readout errors. As a consequence, the present invention makes it possible to accelerate miniaturization and to realize a highly reliable DRAM that allows high integration and low voltage operation.

What is claimed is:

1. A semiconductor device comprising:
   a plurality of sub-array blocks, each said block including a memory array having a plurality of word lines, a plurality of first data lines, a plurality of first memory cells disposed at nodes of said plurality of word lines and said plurality of first data lines, a plurality of second data lines, and a plurality of second memory cells disposed at nodes of said plurality of word lines and said plurality of second data lines, said plurality of second memory cells being provided to check for errors;
   a plurality of sense amplifier circuits connected to said plurality of first data lines and said plurality of second data lines; and
   error detection and correction circuitry connected to the plurality of first data lines and the plurality of second data lines to detect and correct an error in data read out of said plurality of first memory cells and said plurality of second memory cells; and
   an I/O data line which is commonly connected to said plurality of sub-array blocks and carries out I/O operations of data with a sub-array block selected from among said plurality of sub-array blocks,
   wherein a number of said plurality of first memory cells connected to one of said plurality of word lines is larger than that of said plurality of second memory cells connected to the same word line.

2. A semiconductor device according to claim 1, wherein said error detection and correction circuitry can output a signal to invalidate the operations related to said correction.

3. A semiconductor device according to claim 1, wherein each of said plurality of sub-array blocks includes a plurality of redundant bits to replace defective bits which are not operating normally.

4. A semiconductor device according to claim 3, wherein each of said plurality of sub-array blocks includes: error detection and correction circuitry to detect and correct an error in data read out of said plurality of redundant bits.

5. A semiconductor device according to claim 1, wherein said error detection and correction circuitry includes:
   a syndrome generating circuit to generate a syndrome from the data read out from said plurality of first memory cells and said plurality of second memory cells; and
   a decoding circuit to decode said syndrome and to output information to identify the sense amplifier where an error is produced among said plurality of sense amplifiers.

6. A semiconductor device according to claim 1, wherein said error detection and correction circuitry includes a data inverting amplifier circuit to invert data output from a sense amplifier in which an error has been detected.

7. A semiconductor device according to claim 1, further comprising:
   an error bit address detecting circuit to receive a plurality of address signals for selecting said plurality of first memory cells and said plurality of second memory cells; and
   a control signal output from said error detection and correction circuitry and to detect the information on the address of the first and second memory cells where an error occurs,
   wherein said error bit address detecting circuit outputs said information on the address to an external system connected to said memory array.

8. A semiconductor device according to claim 1, further comprising a pad to output a check signal when an error is detected by said error detection and correction circuitry.

9. A semiconductor device provided with a plurality of sub-array blocks, each said block having:
   a memory array having a plurality of word lines, a plurality of first data lines, a plurality of first memory cells disposed at the nodes of said plurality of word lines and said plurality of first data lines, a plurality of second data lines, and a plurality of second memory cells disposed at the nodes of said plurality of word lines and said plurality of second data lines, said plurality of second memory cells being provided to check for errors and used for check bits;
   a plurality of sense amplifier circuits connected to said plurality of first data lines and said plurality of second data lines; and
   error detection and correction circuitry connected to the plurality of first data lines and the plurality of second data lines to detect an error when data is read out from said plurality of first memory cells and said plurality of second memory cells and to correct the detected error,
   wherein each memory array has a number of check bits not less than the least number of check bits necessary for detecting and correcting said error at a time,
   wherein a number of said plurality of first memory cells connected to one of said plurality of word lines is larger than that of said plurality of second memory cells connected to the same word line.

10. A semiconductor device according to claim 9, wherein each of said plurality of sub-array blocks includes a plurality of redundant bits to replace defective bits which are not operating normally.

11. A semiconductor device according to claim 10, further comprising: error detection and correction circuitry to detect an error when the data of said plurality of redundant bits is read out, and to correct said error.

12. A semiconductor device according to claim 9, wherein said error detection and correction circuitry includes:
   means for invalidating operations related to said correction using an output signal; and
   means for invalidating operations related to said detection using said output signal.

13. A semiconductor device comprising:
   a first memory array having a plurality of word lines, a plurality of first data lines, and a plurality of first memory cells disposed at nodes of said plurality of word lines and said plurality of first data lines;
   a second memory array, to check for errors, having a plurality of second data lines, and a plurality of second memory cells disposed at the nodes of said plurality of word lines and said plurality of second data lines;
   a plurality of sense amplifiers disposed for each of said plurality of first data lines and said plurality of second data lines;
   error detection and correction circuitry connected to said plurality of sense amplifiers to detect whether data read out from said plurality of first data lines has errors with the data read out from said plurality of second data lines and to correct the data in which errors are detected; and
   a local I/O line connected to said plurality of sense amplifiers, wherein the corrected data is output through said local I/O line,
   wherein a number of said plurality of first memory cells connected to one of said plurality of word lines is larger than that of said plurality of second memory cells connected to the same word line.

14. A semiconductor device according to claim 13, wherein said error detection and correction circuitry includes:
   a syndrome generating circuit to generate syndrome signals from the data read out from said plurality of first memory cells and said plurality of second memory cells; and
   a decoding circuit to decode said syndrome signals and to output information for identifying the sense amplifier where an error occurs among said plurality of sense amplifiers.

15. A semiconductor device according to claim 13, wherein said error detection and correction circuitry has a data inverting amplifier circuit to invert data output from a sense amplifier for which an error has been detected.

16. A semiconductor device according to claim 13,
   wherein one of said plurality of word lines responds to a command for activation and is activated, and
   wherein said error detecting circuit responds to the activation by detecting whether the data read out by said plurality of sense amplifiers has an error.

17. A semiconductor device according to claim 13, wherein said error detection and correction circuitry generates data to be written into said plurality of second memory cells based on the data stored in said plurality of sense amplifiers corresponding to said plurality of first data lines when the data is written into said plurality of first memory cells.

18. A semiconductor device according to claim 17, wherein said error detection and correction circuitry generates data to be written into said plurality of second memory cells when one of said plurality of word lines is activated and thereafter said activated word line is deactivated.

19. A semiconductor device according to claim 18, wherein the data to be written into said plurality of second memory cells is generated in response to a precharge command.

* * * * *